United States Patent
Lee et al.

(10) Patent No.: US 12,401,368 B2
(45) Date of Patent: Aug. 26, 2025

(54) FLUX-PUMP DAC WITH MULTI-FLUX QUANTUM INJECTION

(71) Applicant: NORTHROP GRUMMAN SYSTEMS CORPORATION, Falls Church, VA (US)

(72) Inventors: Aaron Christopher Lee, Hyattsville, MD (US); Anthony Joseph Przybysz, Linthicum, MD (US); Robert Miller, Hanover, ND (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 149 days.

(21) Appl. No.: 18/315,187

(22) Filed: May 10, 2023

(65) Prior Publication Data

US 2025/0007527 A1    Jan. 2, 2025

(51) Int. Cl.
*H03M 1/66* (2006.01)
*H03K 17/92* (2006.01)
*H03M 1/00* (2006.01)

(52) U.S. Cl.
CPC ............ *H03M 1/002* (2013.01); *H03K 17/92* (2013.01)

(58) Field of Classification Search
CPC ...... H10N 60/12; H10N 60/805; H10N 69/00; H10N 60/10; H10N 60/124; H10N 60/128; H10N 60/80; H03M 1/66; H03M 1/08; H03M 1/0827; H03M 1/1009; H03M 1/80; H03M 13/6597; H03M 3/404; H03M 3/502; H03M 5/02; H03M 5/14; H03M 5/145; H03K 3/38; H03K 19/195; H03K 19/1952;

(Continued)

(56) References Cited

U.S. PATENT DOCUMENTS 9,467,128 B2 * 10/2016 Sakurai ................ H03K 17/687
9,991,864 B2 *  6/2018 Strong ..................... H01P 1/18
(Continued)

FOREIGN PATENT DOCUMENTS

| KR | 1020220113550 A | 8/2022 |
|---|---|---|
| WO | 2020131315 A1 | 6/2020 |
| WO | 2022165074 A1 | 8/2022 |

OTHER PUBLICATIONS

WOISR (Written Opinion & International Search Report) for corresponding PCT/US2024/024611, mailed Aug. 2, 2024.

*Primary Examiner* — Linh V Nguyen
(74) *Attorney, Agent, or Firm* — Tarolli, Sundheim, Covell & Tummino LLP

(57) ABSTRACT

A flux-pump digital-to-analog converter (DAC) includes a ring of Josephson transmission line (JTL) stages. The ring includes multiple injector Josephson junctions (JJs). Each of the multiple injector JJs can be individually activated to inject magnetic flux into the ring in a given AC clock cycle, or controllably deactivated so as not to inject flux during the given AC clock cycle. The flux-pump DAC further includes a load inductor coupled to ring JJs of the ring. The load inductor is configured to store the magnetic flux injected into the ring. Because the flux-pump DAC includes multiple injector JJs arranged around the JTL ring, it can ramp up current loaded into the load inductor faster than a single-injector flux-pump DAC, and with precise, variable controllability of ramp speed so as to provide enhanced adiabaticity.

20 Claims, 31 Drawing Sheets

(58) Field of Classification Search
CPC .. H03K 19/1954; H03K 17/92; H03K 19/003; H03K 19/00315; H03K 19/0175; H03K 19/1774; H03K 19/17744; H03K 19/20; H03K 2005/00286; H03K 3/30; H03K 5/13; H03K 5/131
USPC .......................................................... 341/144
See application file for complete search history.

(56) References Cited

U.S. PATENT DOCUMENTS

| | | | |
|---|---|---|---|
| 11,476,842 B1 | 10/2022 | Herr et al. | |
| 12,102,017 B2 * | 9/2024 | Swenson | H10N 60/12 |
| 2001/0025012 A1 * | 9/2001 | Tarutani | H03F 19/00 |
| | | | 505/100 |
| 2016/0164505 A1 * | 6/2016 | Naaman | H03K 3/38 |
| | | | 327/528 |
| 2016/0335558 A1 * | 11/2016 | Bunyk | G06N 10/40 |
| 2017/0162778 A1 * | 6/2017 | Harris | H03K 19/195 |
| 2020/0301874 A1 | 9/2020 | Shainline | |
| 2021/0013391 A1 * | 1/2021 | Johnson | H03M 1/08 |
| 2023/0046568 A1 * | 2/2023 | Knee | H03K 19/00315 |
| 2024/0020562 A1 * | 1/2024 | Miano | G06N 10/40 |

* cited by examiner

FLUX-PUMP DAC WITH MULTI-FLUX QUANTUM INJECTION

GOVERNMENT INTEREST

The invention was made under Government Contract. Therefore, the US Government has rights to the invention as specified in that contract.

TECHNICAL FIELD

The present invention relates generally to superconducting circuits, and specifically to a flux-pump digital-to-analog converter (DAC) with multi-flux quantum injection.

BACKGROUND

Superconducting digital technology has provided computing and/or communications resources that benefit from high speed, low power dissipation, and low operating temperature. Superconducting digital technology has been developed as an alternative to CMOS technology, typically comprises superconductor-based single flux quantum (SFQ) superconducting circuitry, utilizing superconducting Josephson junctions (JJs), with typical signal power of about 4 nanowatts (nW), at a typical data rate of 20 gigabits per second (Gb/s) or greater, and operating temperatures of around 4 kelvins. Certain superconducting circuits in which JJs are used as active devices can require a DC bias of the JJs. Some systems can provide the DC bias directly using a bias resistor network, which can result in substantially high currents (equal to or greater than an amp), which can result in spurious magnetic fields and heat resulting from high power dissipation. The power budget in such circuits is dominated by static power consumption that happens whether or not the active device is switching. By contrast, reciprocal quantum logic (RQL) systems greatly reduce cold-space resistance and power consumption by providing JJ bias principally as AC bias through an AC clock resonator network.

SUMMARY

An example flux-pump DAC includes a ring of Josephson transmission line stages, the ring comprising at least first and second injector JJs, each of the first and second injector JJs configured to inject flux into the ring. The flux-pump DAC further includes a load inductor coupled to ring JJs of the ring. The load inductor is configured to store the flux injected into the ring.

Another example is a method of multi-flux quantum injection. In a single AC clock cycle, a first quantum of magnetic flux is injected into a Josephson transmission line ring of a flux pump via a first injector in the Josephson transmission line ring. In the same AC clock cycle, a second quantum of magnetic flux is injected into the Josephson transmission line ring via a second injector in the Josephson transmission line ring. The first and second quanta of magnetic flux are stored in a load inductor that is coupled to the Josephson transmission line ring to increase an amount of magnetic flux stored in the load inductor.

Another example is a method of variable-speed flux ramping using multi-flux quantum injection. First and second injectors in a Josephson transmission line ring of a flux pump are activated. Both the first and second injectors inject single flux quanta into the ring in a single AC clock cycle. The injected single flux quanta are stored as magnetic flux in a load inductor coupled to the Josephson transmission line ring at a rate that is based on the number of injectors that are activated. One of the injectors is then deactivated to slow the rate of flux storage in the load inductor.

Another example is a method of controllable loading and unloading of flux in a flux-pump DAC using multi-flux quantum injection. Positive flux quanta are injected into a JTL ring of a flux pump via a first injector in the JTL ring. Negative flux quanta are injected into the JTL ring via a second injector in the JTL ring. Flux is loaded onto and unloaded from a load inductor coupled to the JTL ring. Based on a desired amount of flux not being stored in the load inductor, the positive and/or negative flux quanta injection are repeated until a desired amount of flux is stored by the load inductor.

BRIEF DESCRIPTION OF THE DRAWINGS

FIGS. 2I through 2S are circuit diagrams showing example functioning of the flux-pump DAC of FIG. 2A with two flux injectors activated.

DETAILED DESCRIPTION

Figure 1:
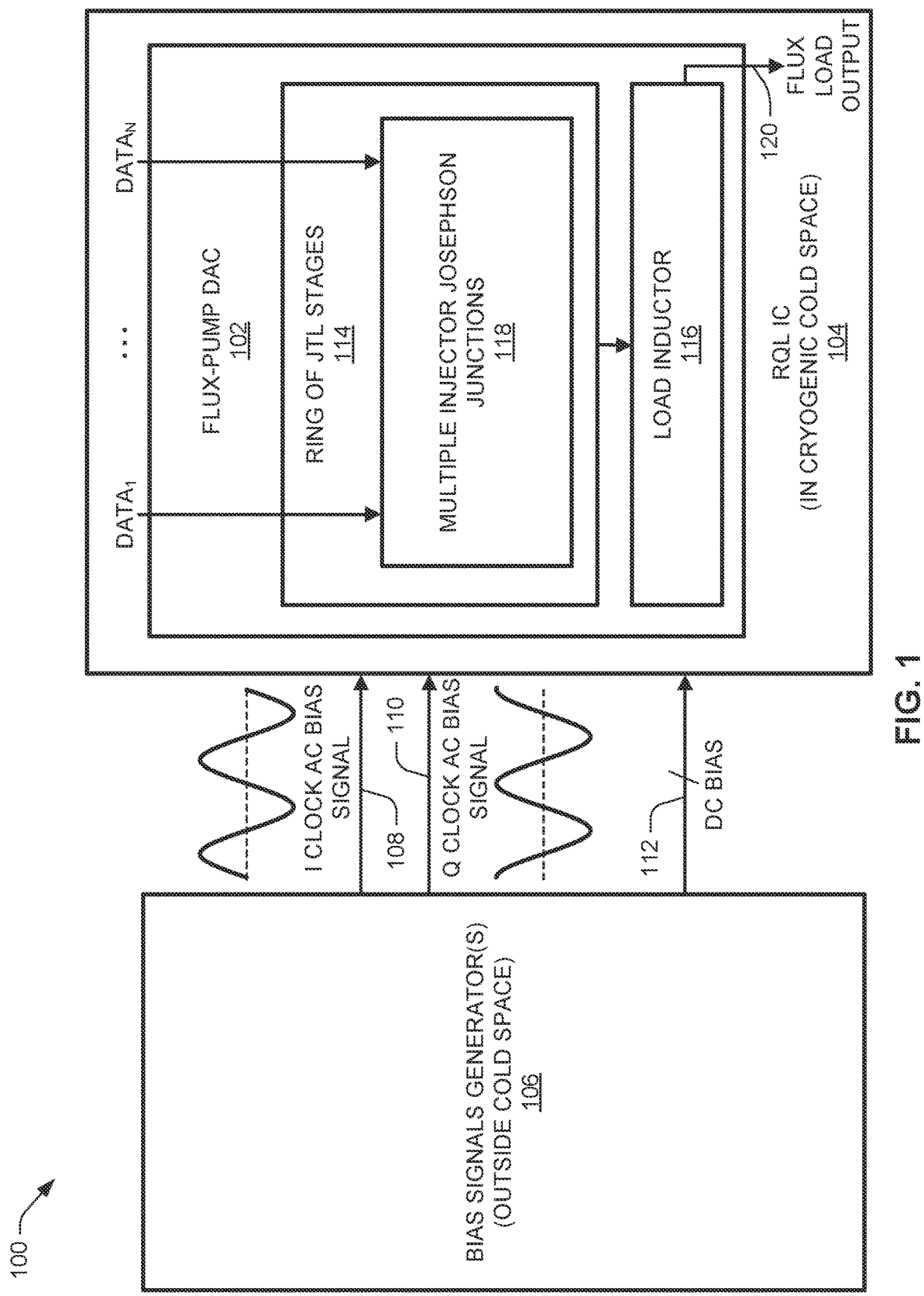
FIG. 1 is block diagram of an example superconducting system with a flux-pump DAC with multi-flux quantum injection.

The present invention relates generally to superconducting circuits, and specifically to a flux-pump DAC with multi-flux quantum injection. Flux is the time integral of voltage. As applied, for example, to an inductor or a JJ, flux is the primary operating parameter governing the function of RQL logic circuits, which may reside inside of a cryogenic cold space that operates at, e.g., around 4 K or below. Flux of determined amounts can be introduced into RQL circuits by, for example, current bias source circuitry operating in a warm space at about room temperature (approximately 300 K) that is coupled to a cold-space probe via coaxial cabling. The probe, and the RQL operative circuitry of the system into which the probe introduces flux, may be meters away from the current bias source circuitry. The probe and cabling are relatively large in comparison to the IC and thus have spatial requirements in the system. The probe and cabling also create a heat link from the cold space to the warm space. Because of the low operating temperature and thermal sequestration requirements of the RQL system, it may be inconvenient, or in some instances impracticable, to directly probe a determined amount of flux into an integrated circuit (IC) on which an RQL system is implemented at various points on the IC.

Accordingly, it can be useful to fabricate the IC with one or more flux-pump DACs each capable of programmably, controllably inputting single flux quanta into a relatively large inductance loop, such that every flux quantum put into the loop augments a circulating current in the loop by an amount that is roughly equal to the magnetic flux quantum divided by the geometric inductance of the loop. The repeated introduction of single flux quanta into the loop thereby builds stored flux in the loop to a determined amount that can be controlled programmably, until the determined amount of flux is stored in the loop, and after which the flux can be provided to a portion of the RQL system that can make use of the flux of the determined amount.

A flux pump adds flux to a load inductor by propagating a flux quantum around a ring of RQL Josephson transmission line (JTL) stages. An injector circuit in the ring allows a single flux quantum into the ring if a data input signal provided to the injector is logical high. Based on the data input signal remaining logical high at the injector circuit, a flux quantum is added to the DAC every clock cycle. The current circulating in the DAC increases by $\Phi_0/L_{LOAD}$, where $\Phi_0$ is the magnetic flux quantum and $L_{LOAD}$ is the inductance of the load inductor, for every flux quantum added to the DAC. The rate at which the current in the DAC increases is affected by the value $L_{LOAD}$ of the load inductance and the clock frequency f. Reducing the load inductance $L_{LOAD}$ increases the current per step and thus the current ramp rate. Increasing the clock frequency f reduces the time per clock cycle, resulting in more current steps up or down in a given amount of time.

There are physical limitations to how much the load inductance $L_{LOAD}$ and the clock frequency f can be adjusted to increase the ramp rate. For example, RQL error rates tend to be larger at higher clock frequencies. Also, in practical implementations, the load inductor may need to be elongated in order to reach DAC target circuitry not collocated near the DAC pump circuitry on an IC. The required length of the load inductor can set a bound on the amount that the load inductance $L_{LOAD}$ can be reduced.

A superconducting loop containing a JJ and an inductor can hold a number of flux quanta that is equal to $\beta_L=2\pi I_C L/\Phi_0$, where $I_C$ is the critical current of the JJ and $\Phi_0$ is the magnetic flux quantum, which is approximately equal to 2.07 mA·pH. If the quantity $\beta_L$ is greater than one for the loop, then the loop can hold a single flux quantum. If the quantity $\beta_L$ is two or greater, there are two or more stable flux conditions for the loop, the number of stable flux conditions being floor ($\beta_L$). Loops having $\beta_L$ of 15 or more, for example, have been constructed for use in RQL systems. The $\beta_L$ of a flux-pump DAC load inductor is also termed the compliance of the flux-pump DAC ring.

Application of a current to a JJ in such a loop, in excess of the JJ's critical current, can admit an indeterminate number of flux quanta to the loop. Flux pumps are circuits capable of programming which stable flux condition a loop undertakes by permitting the loop to reliably admit one flux quantum at a time via circuitry known as an injector, which can include an injector JJ. Flux pumps include a ring of JTL stages, which can, for example, be RQL JTL stages provided with different quadrature phases of an RQL AC clock. The RQL clock can be reliably used to input sequences of SFQ pulses via an injector JJ, to trigger the ring JJs in the JTL stages in the ring, one ring JJ at a time. Each trip around the ring by an input SFQ pulse flips each of the ring JJs once and loads one flux quantum into a load inductor outside of the loop. The injector JJ is a JJ in a loop that is communicatively coupled to a data input. When a data input signal provided to the data input is high, the injector JJ triggers once and admits a flux quantum to the ring of JTL stages. The injector JJ thus provides a known point in the ring at which a flux quantum can start going around the ring of the flux pump.

A flux pump can be configured such that it takes one AC clock cycle to propagate the flux around the ring once. If the data input signal is high at the beginning of a next AC clock cycle, flux will be propagated around the ring another time, and a second flux quantum will thus be loaded into the load inductor. If the data input signal remains high at the beginning of a third AC clock cycle, a third flux quantum will be fed into the load inductor, and so on. The state of the data input signal provided to the injector JJ during a given AC clock cycle is thus what determines whether a flux quantum is loaded into the load inductor of the flux pump for a given clock cycle.

As described herein, a multi-flux quantum injection flux pump can be configured as a DAC capable of loading a load inductor with more than one flux quantum in a single AC clock cycle by providing the ring of JTL stages in the flux pump with multiple injector JJs around the ring. Such configurations permit flux to be loaded faster, without needing to increase the clock speed of the AC clock provided to the flux pump, by loading into the ring a number of flux quanta on every clock cycle that can be at least equal to the number of activated injector JJs in the ring. By controllably routing or specifying input data streams to the injector JJs, the injector JJs in the ring can be individually activated or deactivated each AC clock cycle to provide variable load speeds of the flux-pump DAC, varying between a slowest ramp speed in which only a single injector JJ is activated and a fastest ramp speed in which all injector JJs in the ring are activated.

FIG. 1 illustrates an example superconducting system 100 with a flux-pump DAC 102 with multi-flux quantum injection. The system 100 includes an IC (e.g., an RQL IC) 104 located in a cryogenic cold space and, outside of the cold space, one or more signal generators 106 configured to generate bias signals for provision to the IC 104. Such bias signals can include, as examples, an I clock AC bias signal 108, a Q clock AC bias signal 110 that is 90° out of phase with the I clock AC bias signal 108, and one or more DC bias signals 112. The IC 104 can include operational circuitry (e.g., RQL circuitry) such as JTLs and logic gates (not shown). The IC 104 can further include clock resonators with taps and/or bias lines (not shown) to distribute the AC clock signals 108, 110 and/or the DC bias signals 112 to operational circuitry throughout the IC 104. As an example, the IC 104 can be configured with operational circuitry to perform computation using superconducting signals at microwave clock speeds determined by the AC clock signals 108, 110.

The IC 104 can include a flux-pump DAC 102. In some examples, the IC 104 includes multiple instances of the flux-pump DAC 102. Flux-pump DAC 102, or each instance thereof, includes a ring of JTL stages 114 and a load inductor 116. The ring 114 includes multiple injector JJs 118 each configured to provide a flux quantum to the ring 114 at a different phase of a single cycle of an AC clock. The different phases of the AC clock can be generated, for example, by the above-mentioned resonators and taps (not shown) based on the I clock and Q clock signals 108, 110. As an example, a 0° phase of the AC clock and a 180° phase of the AC clock can be generated based on the I clock signal 108, and a 90° phase of the AC clock and a 270° phase of the AC clock can be generated based on the Q clock signal 110.

Each of the injector JJs 118 can be provided with a respective data input $DATA_1$ through $DATA_N$, where N is an integer equal to the number of injector JJs 118. Different phases of the AC clock can be provided (e.g., via different resonator and tap configurations) for each of the N injector JJs. As examples, four AC clock phases (0°, 90°, 180°, 270°) can be generated for provision to an example DAC 102 with N=2 injector JJs 118, eight AC clock phases (0°, 45°, 90°, 135°, 180°, 225°, 270°, 315°) can be generated for provision to an example DAC 102 with N=4 injector JJs, and so on.

The ring 114 and load inductor 116 are configured such that with each SFQ input provided to the ring 114 by an individual one of the multiple injector JJs 118, a single quantum of flux is made to circulate in a loop that includes the load inductor 116. The load inductor is thereby sequentially "loaded" with flux, with the rate at which the load inductor 116 is loaded depending on the size of the load inductor 116, the number N of injector JJs 118, the rate of the AC clock signals 108, 110, and the routing and/or specified form of the input data signals $DATA_1$ through $DATA_N$.

The load inductor 116 can be programmatically configured to store a desired amount of flux, e.g., at a linear or variable ramp rate determined by the specified form of the input data signals $DATA_1$ through $DATA_N$. Upon the desired amount of flux being stored in the load inductor 116, the load inductor 116 can output the stored amount of flux (e.g., via a transformer coupling or other coupling) to a flux load output 120, e.g., target RQL circuitry on the IC 104.

Figure 2A:
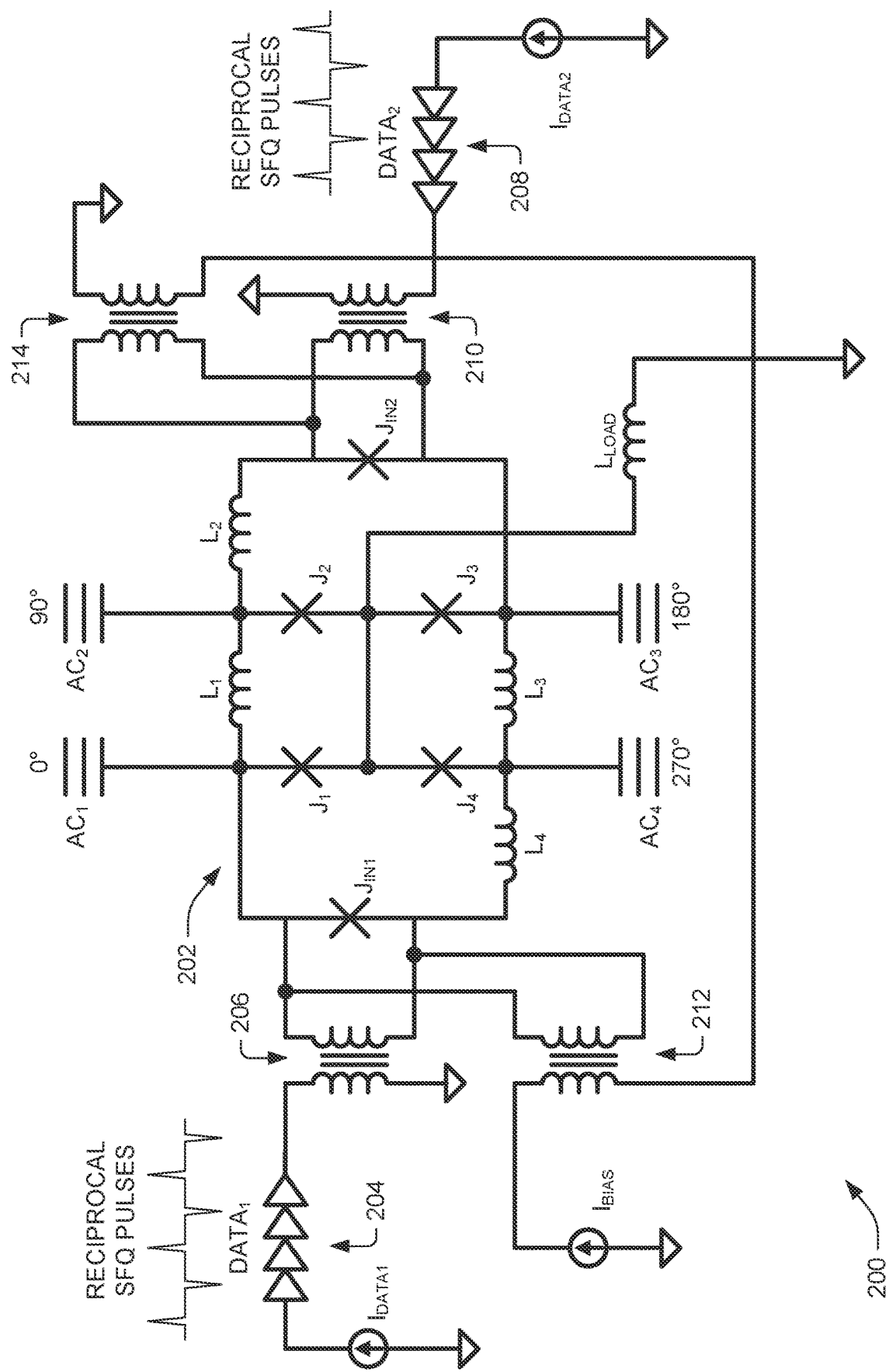
FIG. 2A is a circuit diagram of an example flux-pump DAC with multi-flux quantum injection having two flux injectors in a pump ring, one at a 0° clock phase and one at a 180° clock phase.

FIG. 2A shows an example circuit 200 for a flux-pump DAC with multi-flux quantum injection. The circuit 200 can correspond, for example, to the flux pump 102 of FIG. 1. The circuit 200 includes a ring 202 of JTL stages. The ring 202 can correspond, for example, to the ring 114 of FIG. 1. In the example circuit 202, four JTL stages are illustrated, each with a respective ring JJ $J_1$, $J_2$, $J_3$, $J_4$. Each ring JTL stage in the ring 202 shares its respective ring JJ with a succeeding JTL stage in the ring 202 via one of the ring inductors $L_1$, $L_2$, $L_3$, $L_4$, such that when a leading ring JJ on a ring JTL stage is triggered, flux is propagated (e.g., clockwise) along the ring 202. Triggering of a ring JJ of a succeeding JTL stage annihilates the loop current in a preceding stage. Each respective ring JJ $J_1$, $J_2$, $J_3$, $J_4$ is coupled at a first end to a looping superconducting path that includes, in series, the four ring inductors $L_1$, $L_2$, $L_3$, $L_4$, and at a second end to ground via a load inductor $L_{LOAD}$. A central electrical node of the ring couples each of the ring JJs $J_1$, $J_2$, $J_3$, $J_4$ to each other and to the load inductor $L_{LOAD}$.

The circuit 200 of FIG. 2A further includes two injector JJs $J_{IN1}$, $J_{IN2}$ arranged on the looping superconducting path of the ring 202, in series with the four ring inductors $L_1$, $L_2$, $L_3$, $L_4$. The injector JJs $J_{IN1}$, $J_{IN2}$ can collectively correspond, for example, to the injector JJs 118 of FIG. 1. Each injector JJ is communicatively coupled to a respective data input to receive a respective data input signal. First injector JJ $J_{IN1}$ is coupled to receive first data input signal $DATA_1$ via first input JTLs 204 and first data input transformer 206. Second injector JJ $J_{IN2}$ is coupled to receive second data input signal $DATA_2$ through second input JTLs 208 and second data input transformer 210. Injector JJs $J_{IN1}$, $J_{IN2}$ can be provided DC bias from a DC bias source $I_{BIAS}$ via transformers 212, 214. First and second data current sources $I_{DATA1}$ and $I_{DATA2}$ are illustrated in FIG. 2A as current source elements for purposes of simplicity. In examples not illustrated, data SFQ pulses forming the data input signals $DATA_1$, $DATA_2$ can be delivered to the data input JTLs 204, 208 from one or more controllers and/or via superconducting signal switches and/or routers. A logical high signal for the input signals $DATA_1$, $DATA_2$ can have a wave-pipelined logic (WPL) format of the presence of reciprocal pulses, e.g., a positive pulse followed by a negative pulse. Logical low signals for each of the first input signal $DATA_1$ and the second input signal $DATA_2$ can have the WPL format of the absence of SFQ pulses. This WPL data formatting can be referred to as return-to-zero (RZ) data formatting. In other examples (not illustrated), phase-mode-logic (PML) data formatting can be used. The injector JJs $J_{IN1}$, $J_{IN2}$ are larger than (have a critical current higher than) the ring JJs $J_1$, $J_2$, $J_3$, $J_4$. For example, if the ring JJs $J_1$, $J_2$, $J_3$, $J_4$ have a critical current of between about 40 microamps and about 80 microamps, e.g., about 60 microamps, the injector JJs have a critical current of between about 100 microamps and about 180 microamps, e.g., about 140 microamps.

The circuit 200 of FIG. 2A further includes AC clock resonator taps $AC_1$, $AC_2$, $AC_3$, $AC_4$ to supply AC bias to components of the ring 202. The direction along the ring 202 in which flux propagation occurs depends on the sequential arrangement of bias tap phases. In the illustrated example, first AC clock resonator tap $AC_1$ provides AC bias at a 0° phase of the AC clock, second AC clock resonator tap $AC_2$ provides AC bias at a 90° phase of the AC clock, third AC clock resonator tap $AC_3$ provides AC bias at a 180° phase of the AC clock, and fourth AC clock resonator tap $AC_4$ provides AC bias at a 270° phase of the AC clock. First ring JJ $J_1$ and first injector JJ $J_{IN1}$ are both AC-biased primarily by AC bias tap $AC_1$. Second ring JJ $J_2$ is AC-biased primarily by AC bias tap $AC_2$. Third ring JJ $J_3$ and second injector JJ $J_{IN2}$ are both AC-biased primarily by AC bias tap $AC_3$. Fourth ring JJ $J_4$ is AC-biased primarily by AC bias tap $AC_4$. A clockwise direction of flux propagation for the illustrated example circuit 200 results from the clockwise arrangement of the succession of phases of the AC clock resonator taps $AC_1$, $AC_2$, $AC_3$, $AC_4$. In other examples, not illustrated, the direction of flux propagation can be made to be counter-clockwise by rearrangement (e.g., order reversal) of the AC resonator tap phases with respect to each other. In some examples, the injector junction DC bias $I_{BIAS}$ can also be adjusted (e.g., zeroed or reversed) to provide different circuit functionalities.

The example circuit 200 of FIG. 2A further includes a load inductor $L_{LOAD}$. The load inductor $L_{LOAD}$ is electrically coupled, directly or indirectly, at one end to a central electrical node of the ring 202 and at the other end to ground. As flux quanta are admitted the ring 202, and as flux propagates around the ring 202, current through the load inductor $L_{LOAD}$ increases, effectively storing flux in the load inductor $L_{LOAD}$. The stored flux can subsequently be off-loaded from the load inductor and provided to another circuit or system on the same IC on which the circuit 200 is implemented, e.g., via switch and/or routing elements (not shown). The inductance of the load inductor $L_{LOAD}$ can be relatively larger than other inductances in the circuit 200. As an example, if the ring inductors $L_1$, $L_2$, $L_3$, La have inductances on the order of picohenries (e.g., about 10 picohenries), the load inductor $L_{LOAD}$ can have an inductance on the order of nanohenries (e.g., about 1 nanohenry).

The data input transformers 206, 210 can, for example, have a transformer ratio of greater than about 1:1 (e.g., about 2:1). As examples, the primary inductors of the data input transformers 206, 210 can have inductances of about 10 picohenries and the secondary inductors of the data input transformers 206, 210 can have inductances of about 5 picohenries. The DC bias transformers 212, 214 can, for example, have a transformer ratio of about 1:1. As examples, the primary inductors of the DC bias transformers 212, 214 can have inductances of 60 picohenries and the secondary inductors of the DC bias transformers 212, 214 can likewise have inductances of about 60 picohenries.

Figure 2B:
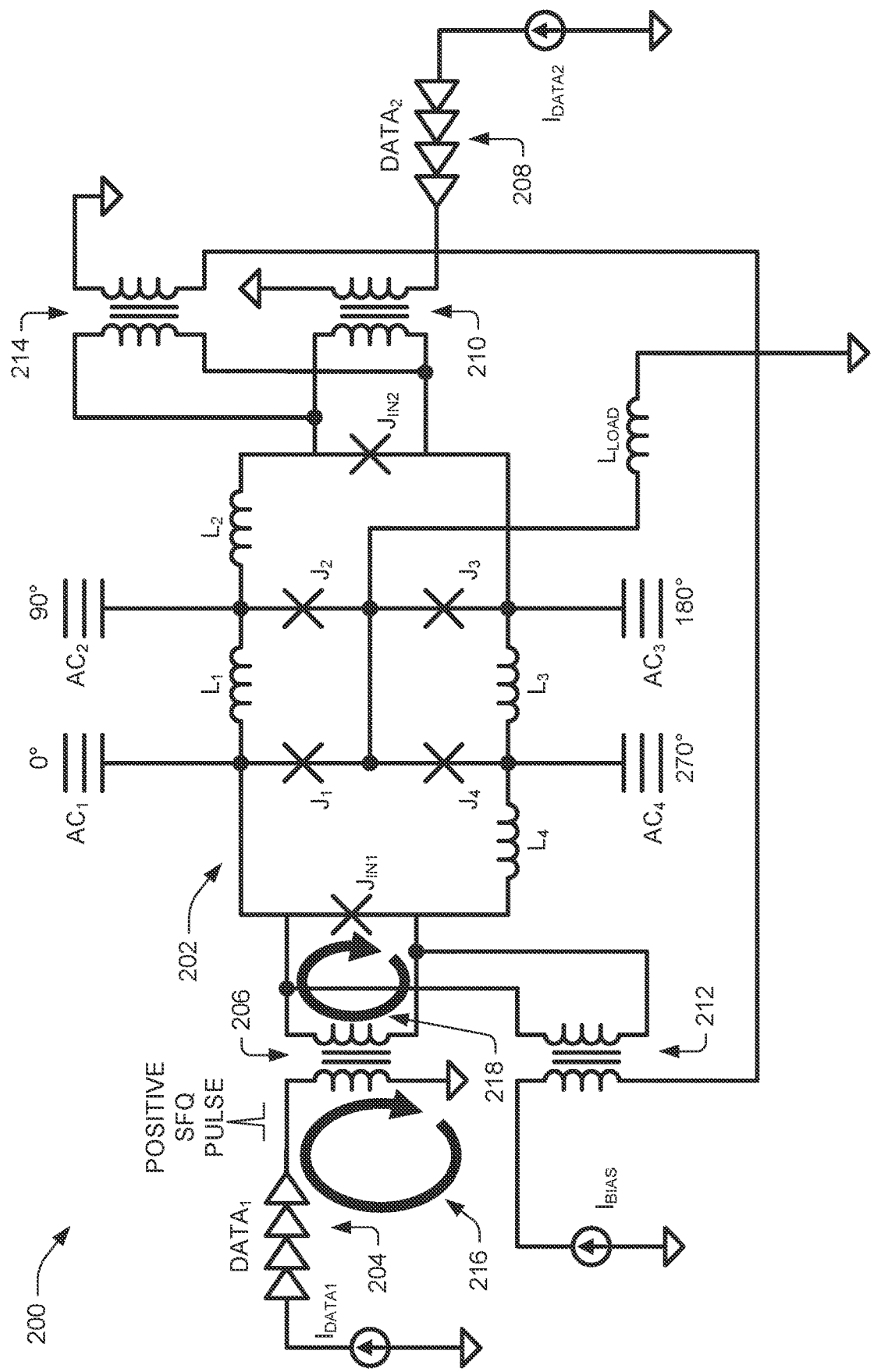
FIGS. 2B through 2H are circuit diagrams showing example functioning of the flux-pump DAC of FIG. 2A with one flux injector activated.
Figure 2C:
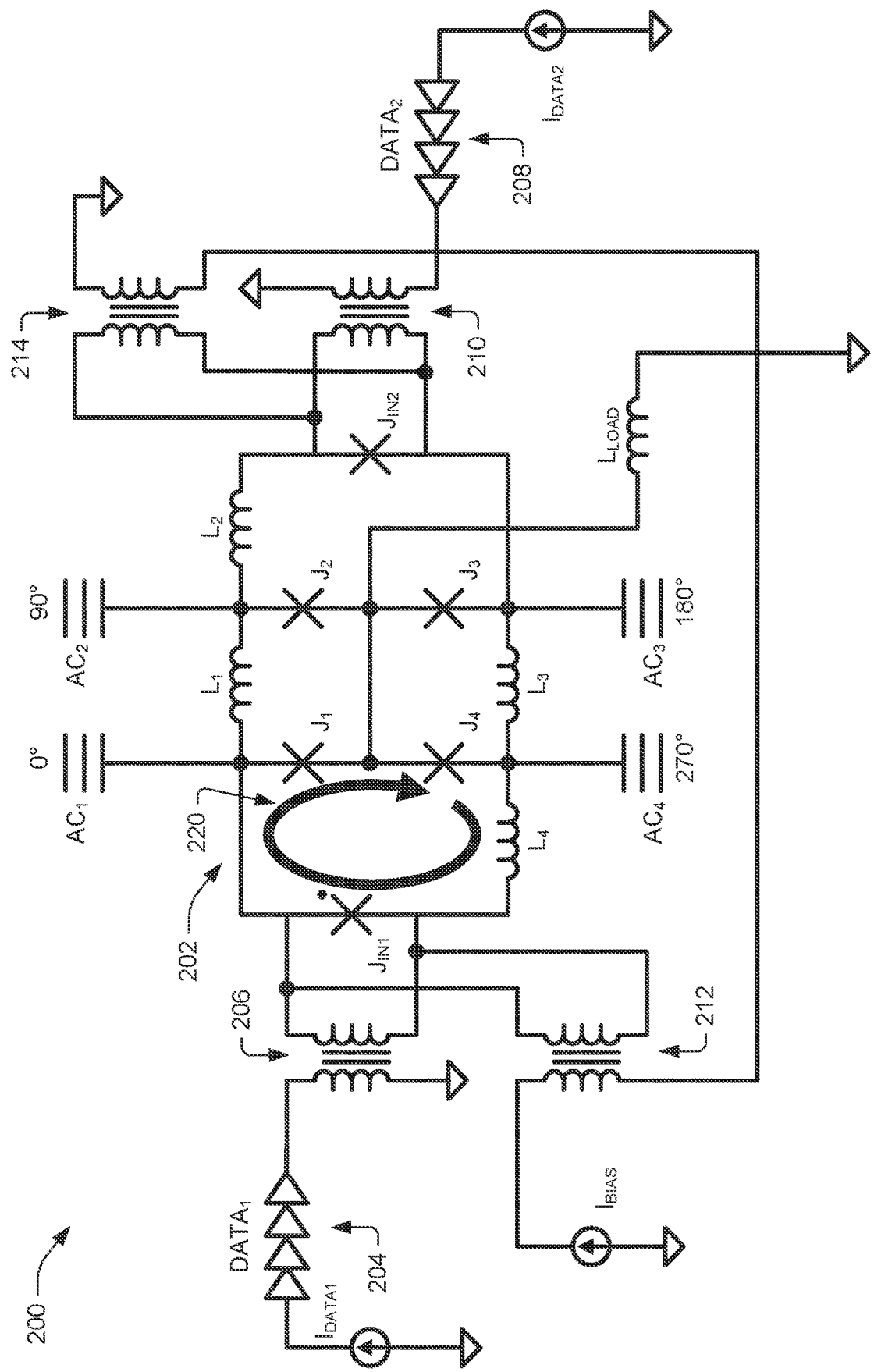

FIGS. 2B through 2H illustrate the functioning of the circuit 200 of FIG. 2A when flux is injected into the ring 202 by only the first flux injector JJ $J_{IN1}$ responsive to a logical high WPL SFQ pulse input by first data input signal $DATA_1$ via first input JTLs 204 and first input transformer 206. In the example of FIGS. 2B through 2H, flux is not also injected into the ring 202 by the second flux injector JJ $J_{IN2}$. FIG. 2B shows superconducting loop current 216 output from the first input JTLs 204, which induces loop current 218 via first input transformer 206. When current through a JJ, including circulating current in a superconducting loop of which the JJ is a part and any superposed bias currents, exceeds the critical current of the JJ, the JJ triggers. Given sufficient DC and AC biasing conditions for first injector JJ $J_{IN1}$, loop current 218 causes first injector JJ $J_{IN1}$ to trigger in the positive direction, propagating loop current 218 into the ring 202 as loop current 220, as shown in FIG. 2C. In accordance with standard notation for JJ phase, a dot above a JJ indicates the direction of triggering of the JJ. The first injector JJ $J_{IN1}$ thus admits one flux quantum into the ring 202 while also annihilating the loop current 218 circulating in the loop that includes the secondary inductor of the first input transformer 206 and the first injector JJ $J_{IN1}$.

Figure 2D:
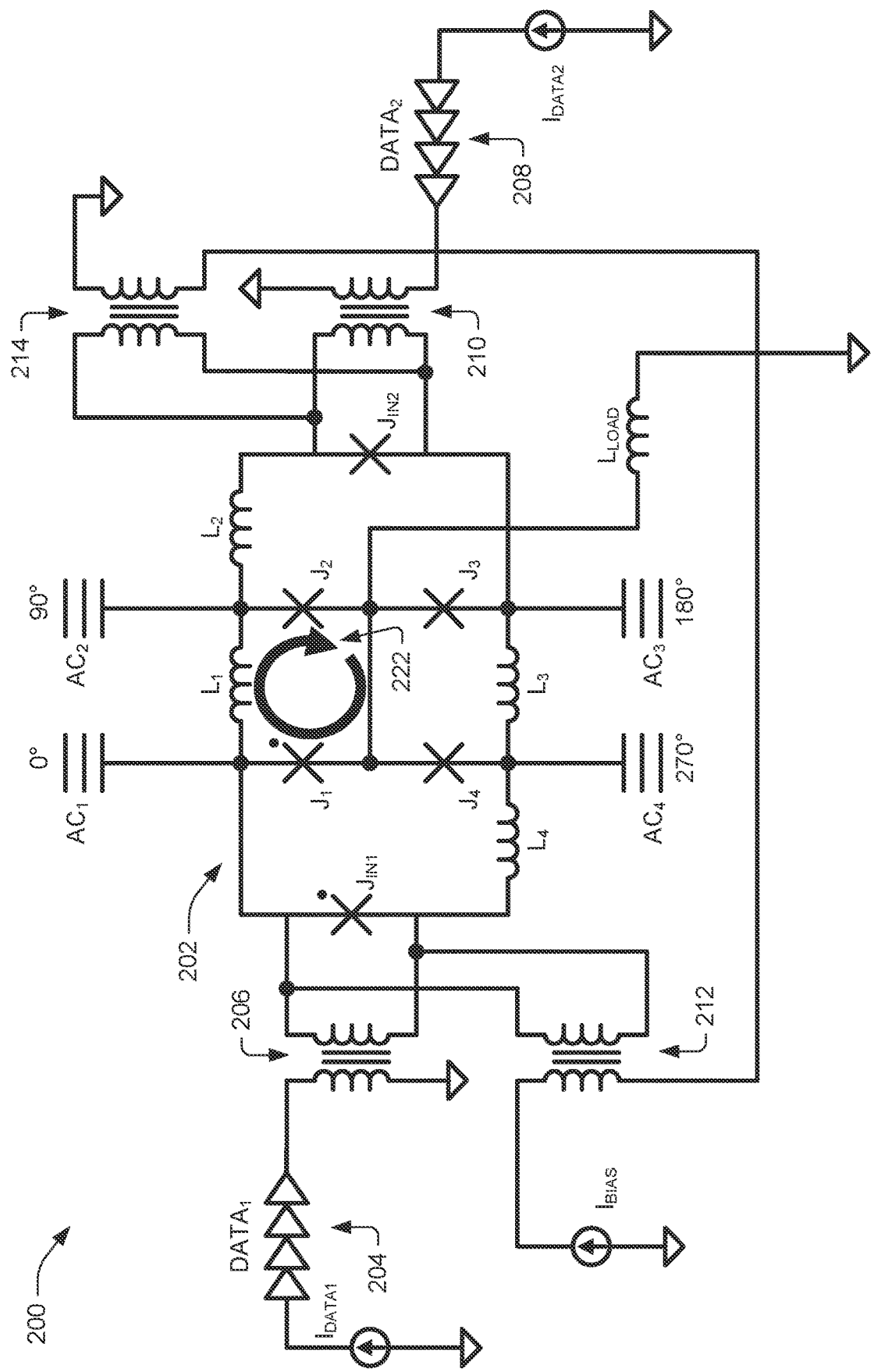

Given sufficient DC and AC biasing conditions for first ring JJ $J_1$, loop current 220, in combination with bias from 0° resonator tap $AC_1$, causes first ring JJ $J_1$ to trigger in the positive direction (toward the outside of the ring 202), advancing loop current 220 clockwise through the ring 202 as loop current 222, as shown in FIG. 2D.

Figure 2E:
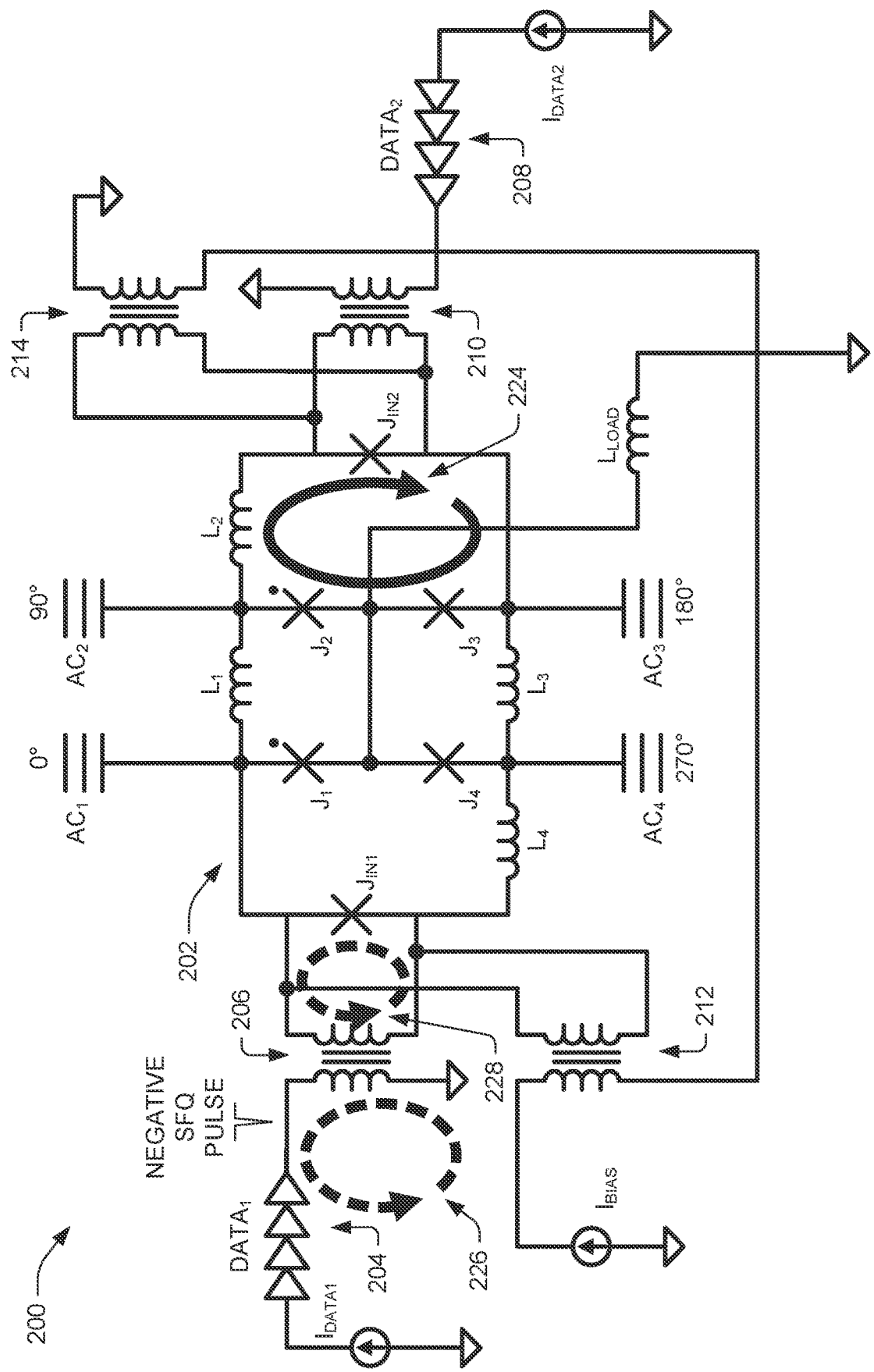
Figure 2F:
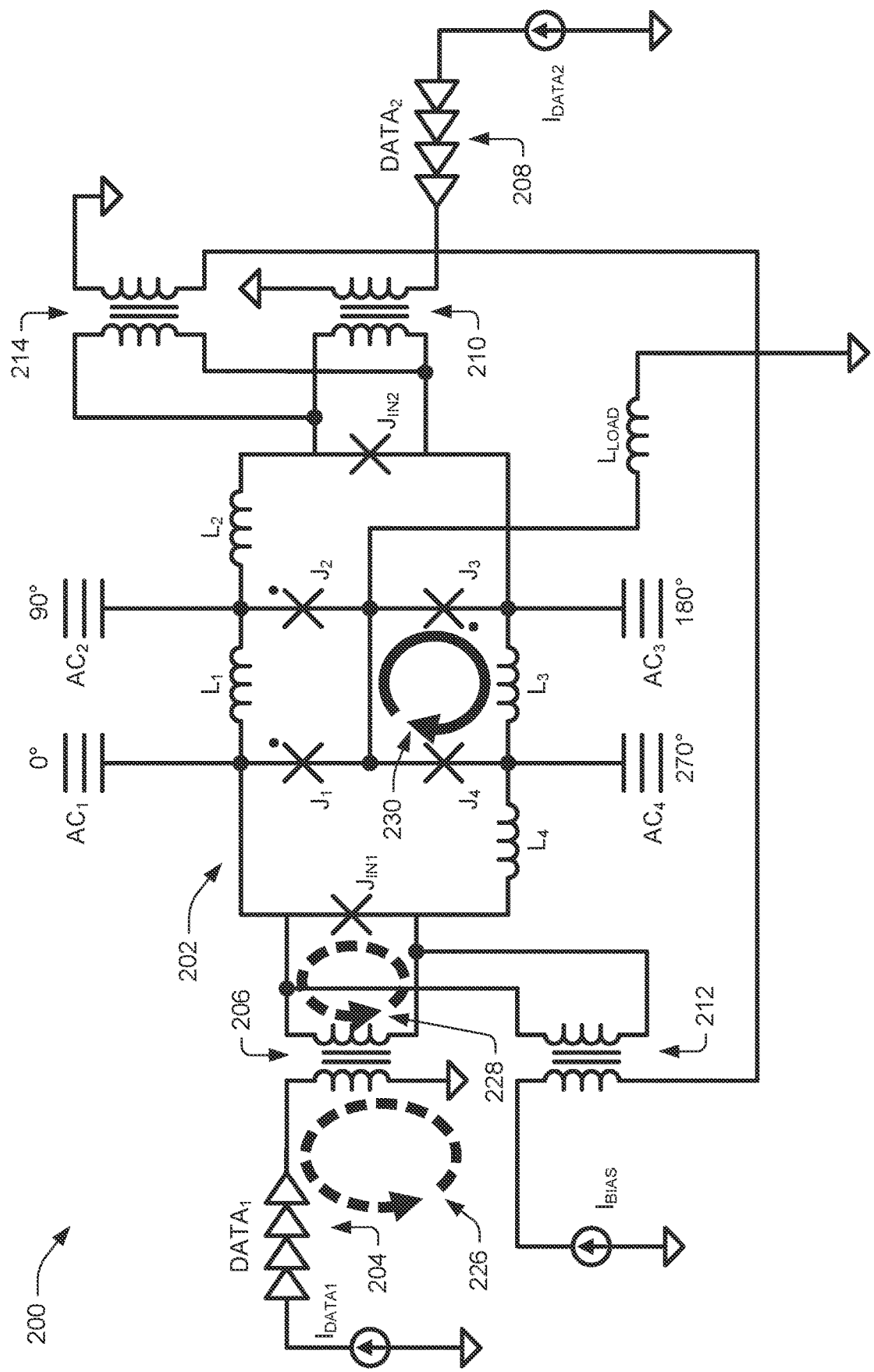

About one quarter of an AC clock cycle after the advancement through the ring 202 of loop current 220 (shown in FIG. 2C) as loop current 222 (shown in FIG. 2D), DC and AC biasing conditions can become sufficient for second ring JJ $J_2$ to trigger in the positive direction (toward the outside of the ring 202). Loop current 222, in combination with bias from 90° resonator tap $AC_2$, then causes second ring JJ $J_2$ to trigger, advancing loop current 222 through the ring 202 as loop current 224, as shown in FIG. 2E. FIG. 2E also shows that about half an AC clock cycle after first input signal $DATA_1$ introduces loop current 216 and thereby induces loop current 218 via the introduction of a first SFQ pulse through first input JTLs 204, first input signal $DATA_1$ can introduce loop current 226 and thereby induce loop current 228 via the introduction of a second input SFQ pulse, which is reciprocal to the first input SFQ pulse, through first input JTLs 204. For example, if the first SFQ pulse (in FIG. 2B) is a positive SFQ pulse, the second, reciprocal SFQ pulse (in FIG. 2D) can be a negative SFQ pulse. However, biasing conditions at first injector JJ $J_{IN1}$ are not sufficient for admitting loop current 228 into the ring 202 at the time of FIG. 2E. Accordingly, loop currents 226, 228 remain in place, as shown in FIG. 2F.

About another quarter of an AC clock cycle after loop current 222 is advanced clockwise through the ring 202 as loop current 224, DC and AC biasing conditions become sufficient for third ring JJ $J_3$ to trigger in the positive direction (toward the outside of the ring 202). Loop current 224, in combination with bias from 180° resonator tap $AC_3$, then causes third ring JJ $J_3$ to trigger, advancing loop current 224 clockwise through the ring 202 as loop current 230, as shown in FIG. 2F.

Figure 2G:
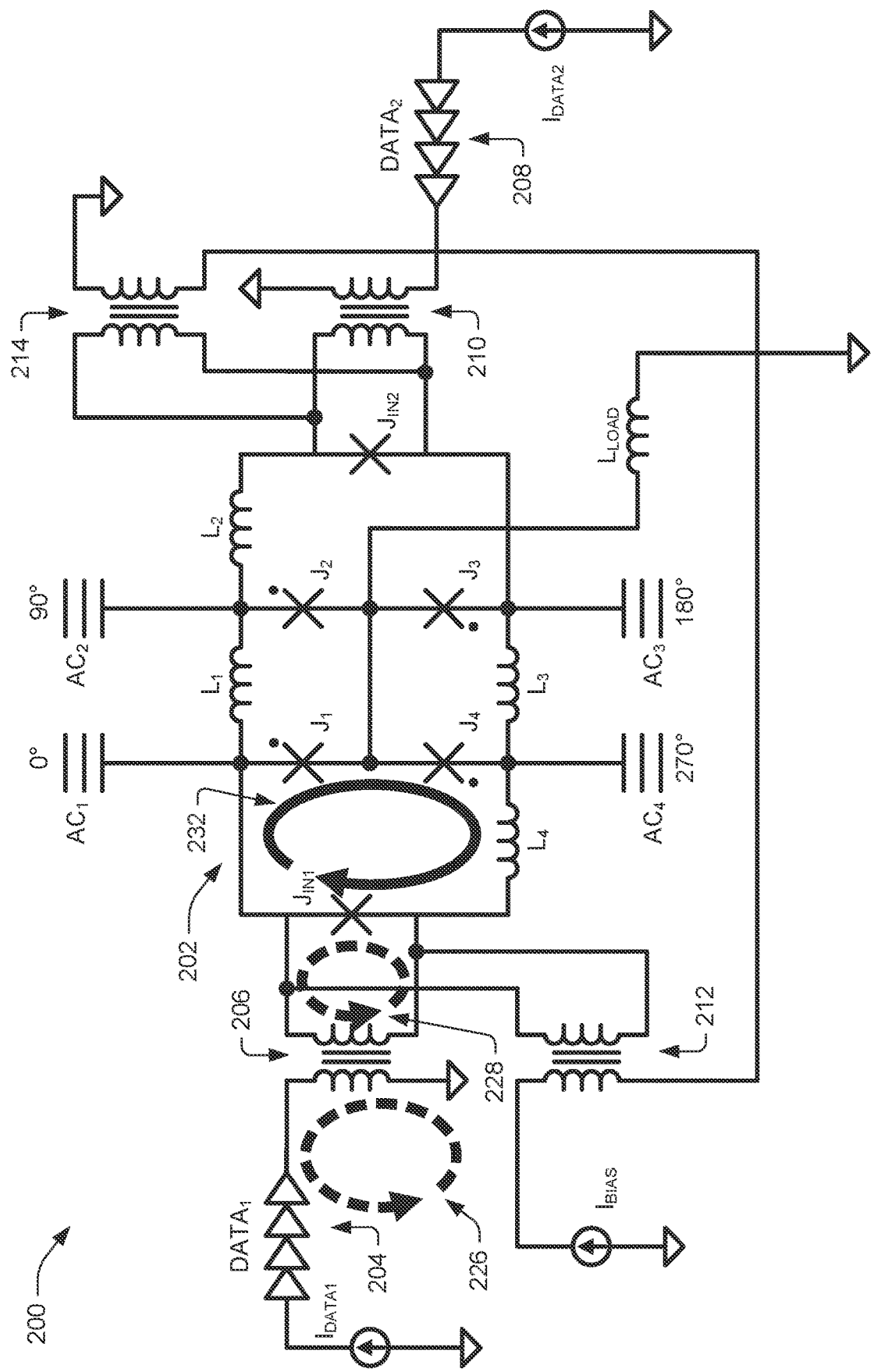
Figure 2H:
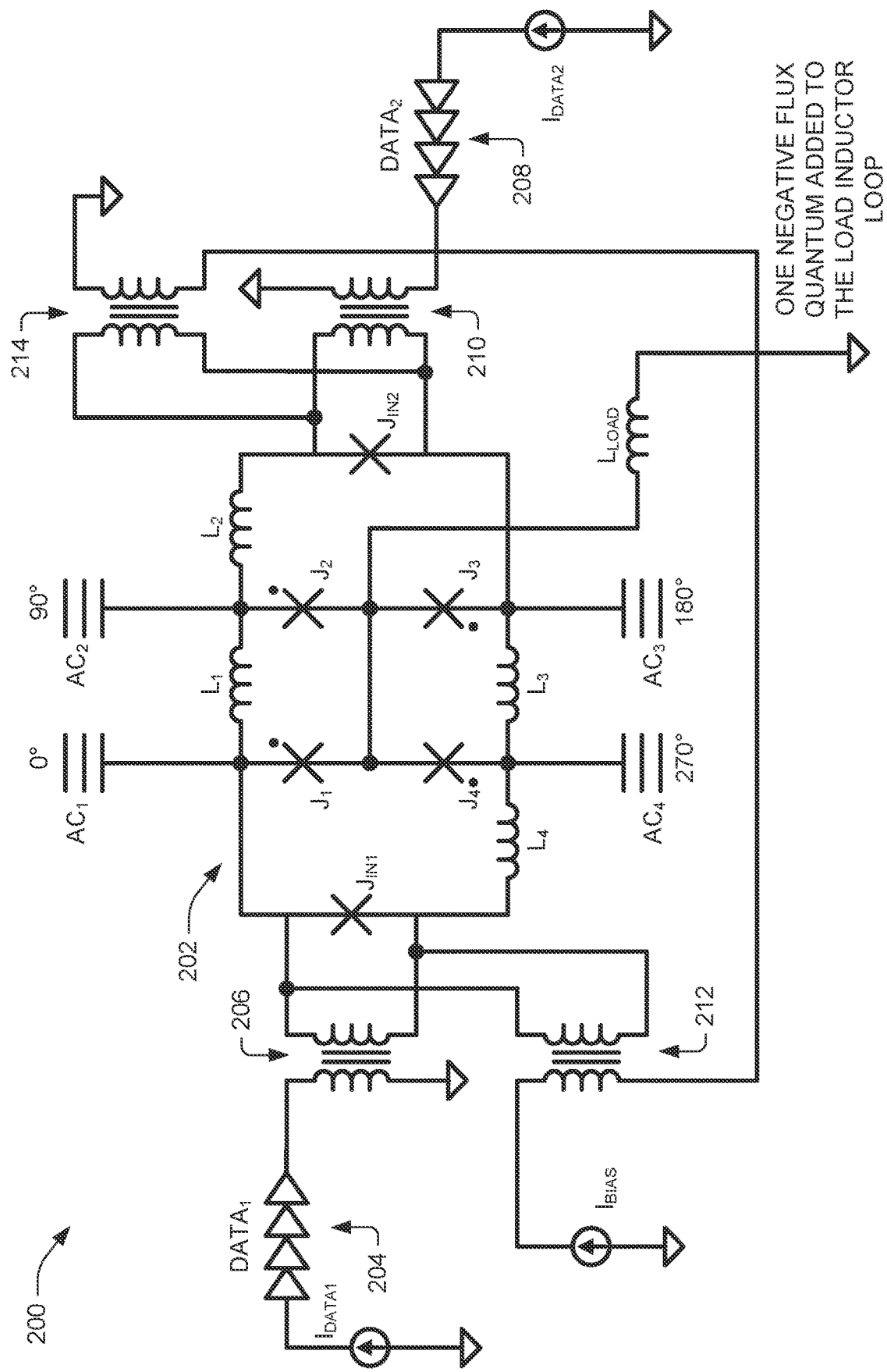
Figure 21:
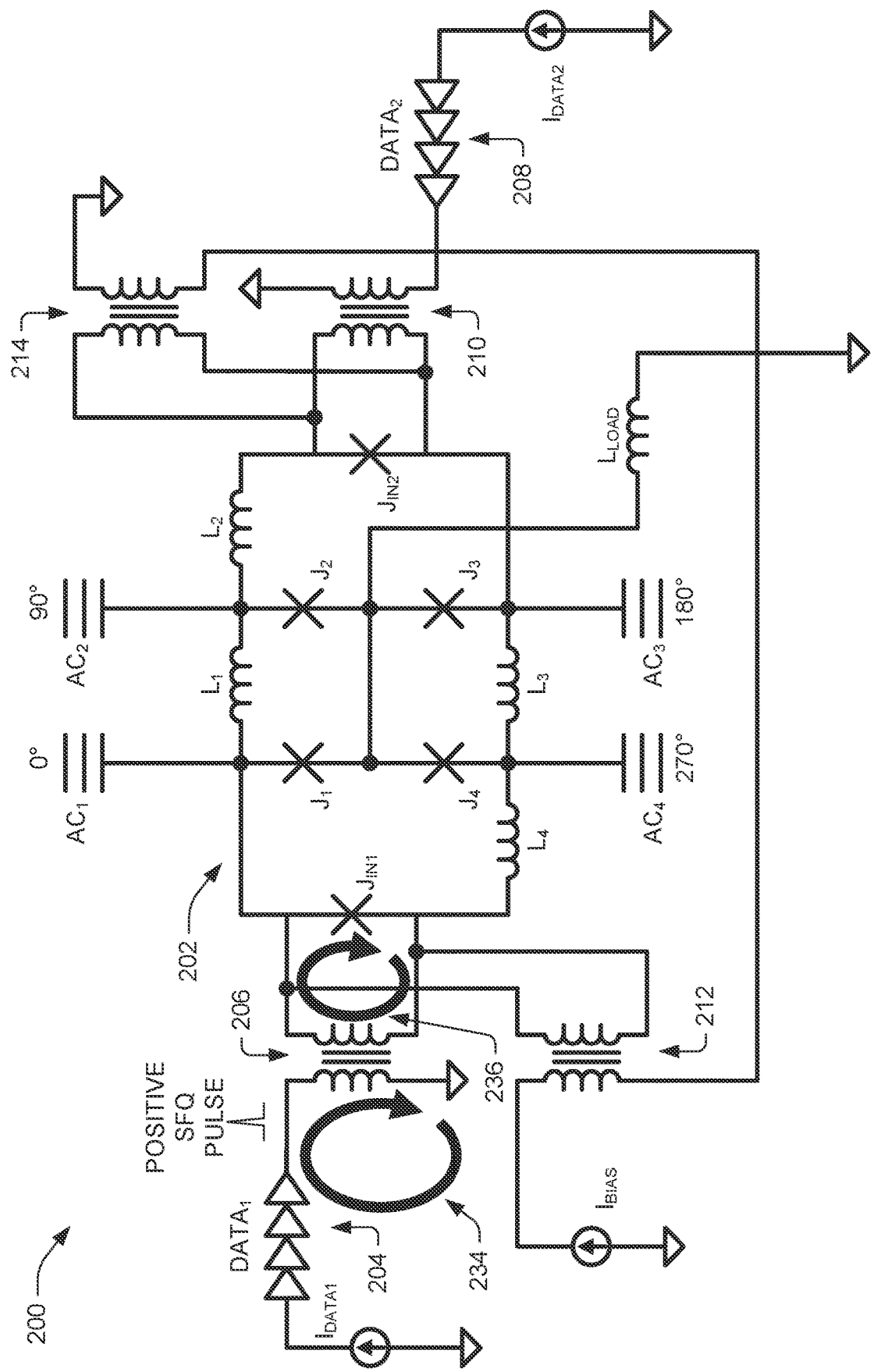

About another quarter of an AC clock cycle later, DC and AC biasing conditions become sufficient for fourth ring JJ $J_4$ to trigger in the positive direction (toward the outside of the ring 202). Loop current 230, in combination with bias from 270° resonator tap $AC_4$, then causes fourth ring JJ $J_4$ to trigger, advancing loop current 230 clockwise through the ring 202 as loop current 232, as shown in FIG. 2G. Loop currents 232 and 228, which are about equal and opposite each other through first injector JJ $J_{IN1}$, annihilate each other, resulting in the circuit state shown in FIG. 2H, in which there remain no more substantial loop currents within the ring 202, and all ring JJs $J_1$, $J_2$, $J_3$, $J_4$ have been set at positive $2\pi$ radian phase.

With each advance of the loop currents 220, 222, 224, 230, 232 through the ring 202 in each of FIGS. 2D through 2G, more negative flux is stored by load inductor $L_{LOAD}$ (the negative sign of the flux being defined by the current flowing through the load inductor $L_{LOAD}$ from ground toward the center of the ring 202). If first data input signal $DATA_1$ remains logical high (e.g., if reciprocal SFQ pulses continue to be introduced through first input JTLs 204), the cycle of flux admission and propagation through the ring 202 (as shown in FIGS. 2B through 2H) repeats, accumulating more negative flux in the load inductor $L_{LOAD}$, until compliance of the ring 202 is reached. If, however, first data input signal $DATA_1$ is not logical high, no further flux is admitted to the ring 202 and no further negative flux is accumulated in the load inductor $L_{LOAD}$.

Thus, the process of FIGS. 2B through 2H can be used to load a precisely controlled amount of negative flux onto the load inductor $L_{LOAD}$. Subsequent to the loading of the load inductor $L_{LOAD}$ with a desired amount of negative flux, the load inductor $L_{LOAD}$ can be, e.g., transformer-coupled to another portion of RQL circuitry on the same IC as circuit 200, transferring the negative flux stored in the load inductor $L_{LOAD}$ to the other portion of RQL circuitry and thus unloading the negative flux that had been accumulated to a precisely desired amount on the load inductor $L_{LOAD}$.

FIGS. 2I through 2S illustrate the functioning of the circuit 200 of FIG. 2A when flux is injected into the ring 202 by both (1) the first flux injector JJ $J_{IN1}$, responsive to a logical high WPL SFQ pulse input by first data input signal $DATA_1$ via first input JTLs 204 and first input transformer 206, and (2) the second flux injector JJ $J_{IN2}$, responsive to a logical high WPL SFQ pulse input by second data input signal $DATA_2$ via second input JTLs 208 and second input transformer 210. In the illustrated example, a positive SFQ pulse is supplied by the second data input signal $DATA_2$ as late as about one half AC clock cycle later than a positive SFQ pulse supplied by the first data input signal $DATA_1$.

Figure 2J:
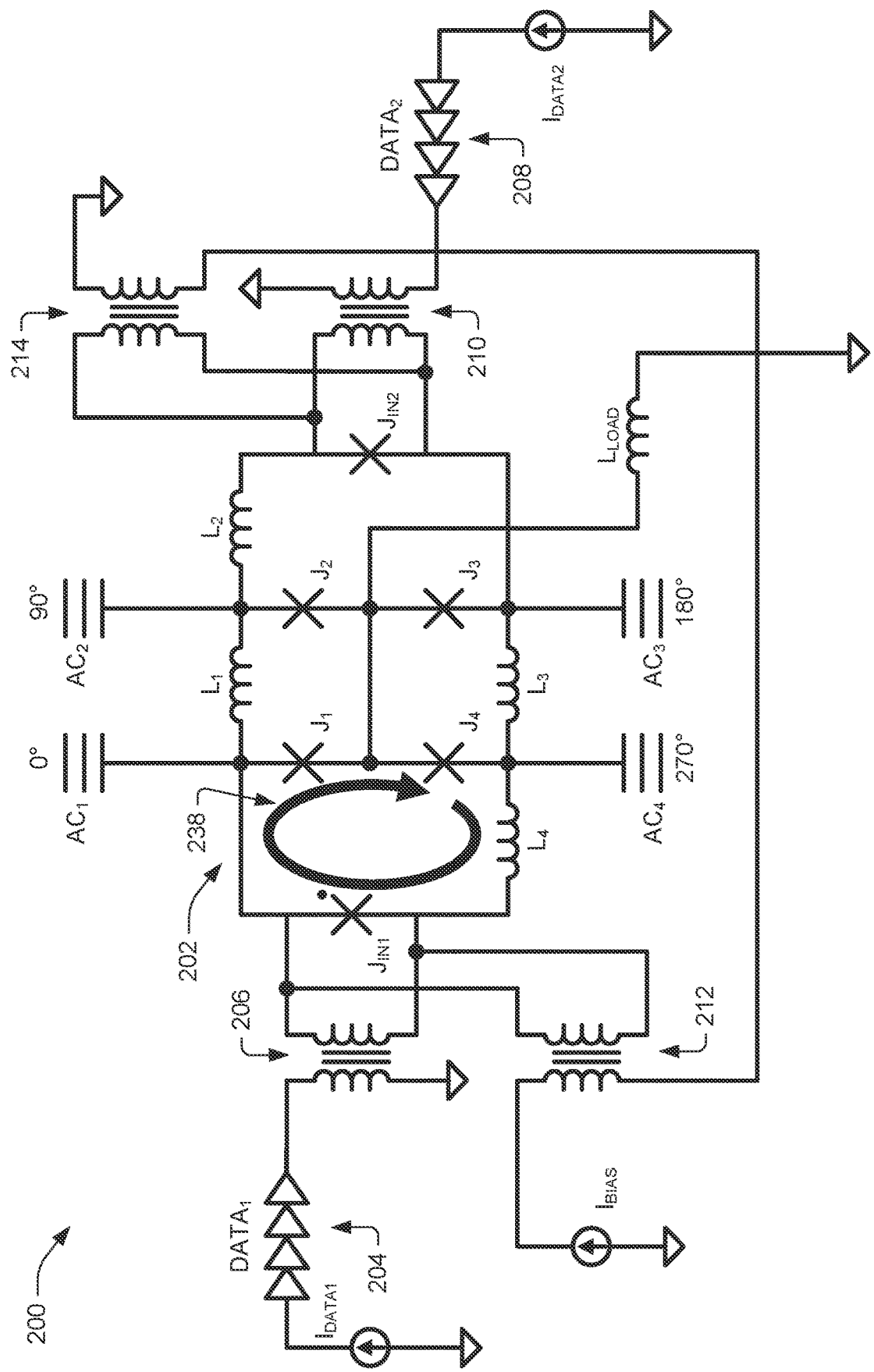

FIG. 2I shows superconducting loop current 234 output from the first input JTLs 204, which induces loop current 236 via first input transformer 206. Given sufficient DC and AC biasing conditions for first injector JJ $J_{IN1}$, loop current 236 causes first injector JJ $J_{IN1}$ to trigger in the positive direction, propagating loop current 236 into the ring 202 as loop current 238, as shown in FIG. 2J. The first injector JJ $J_{IN1}$ thus admits one flux quantum into the ring 202 while also annihilating the loop currents 234, 236.

Figure 2K:
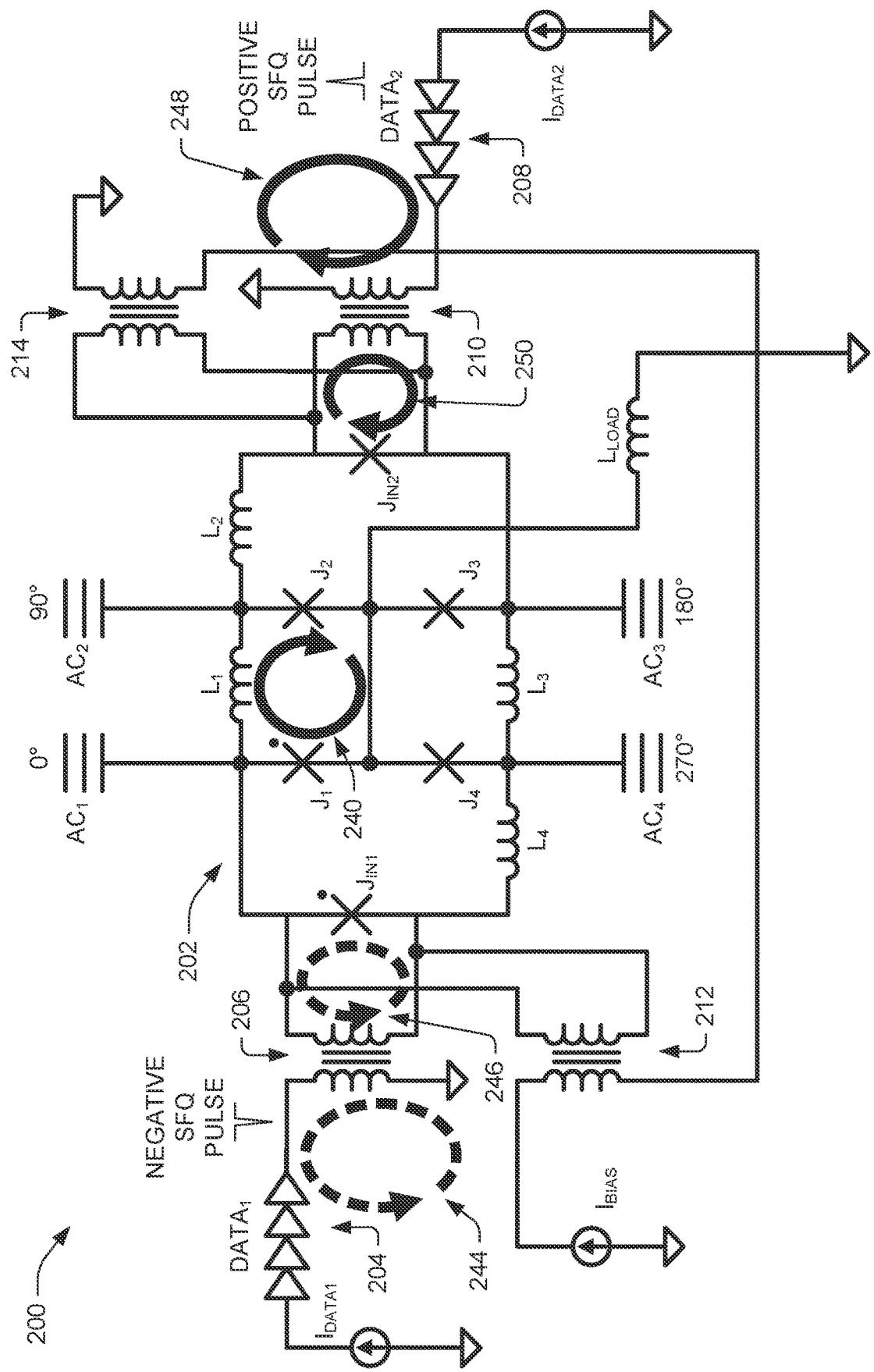
Figure 2L:
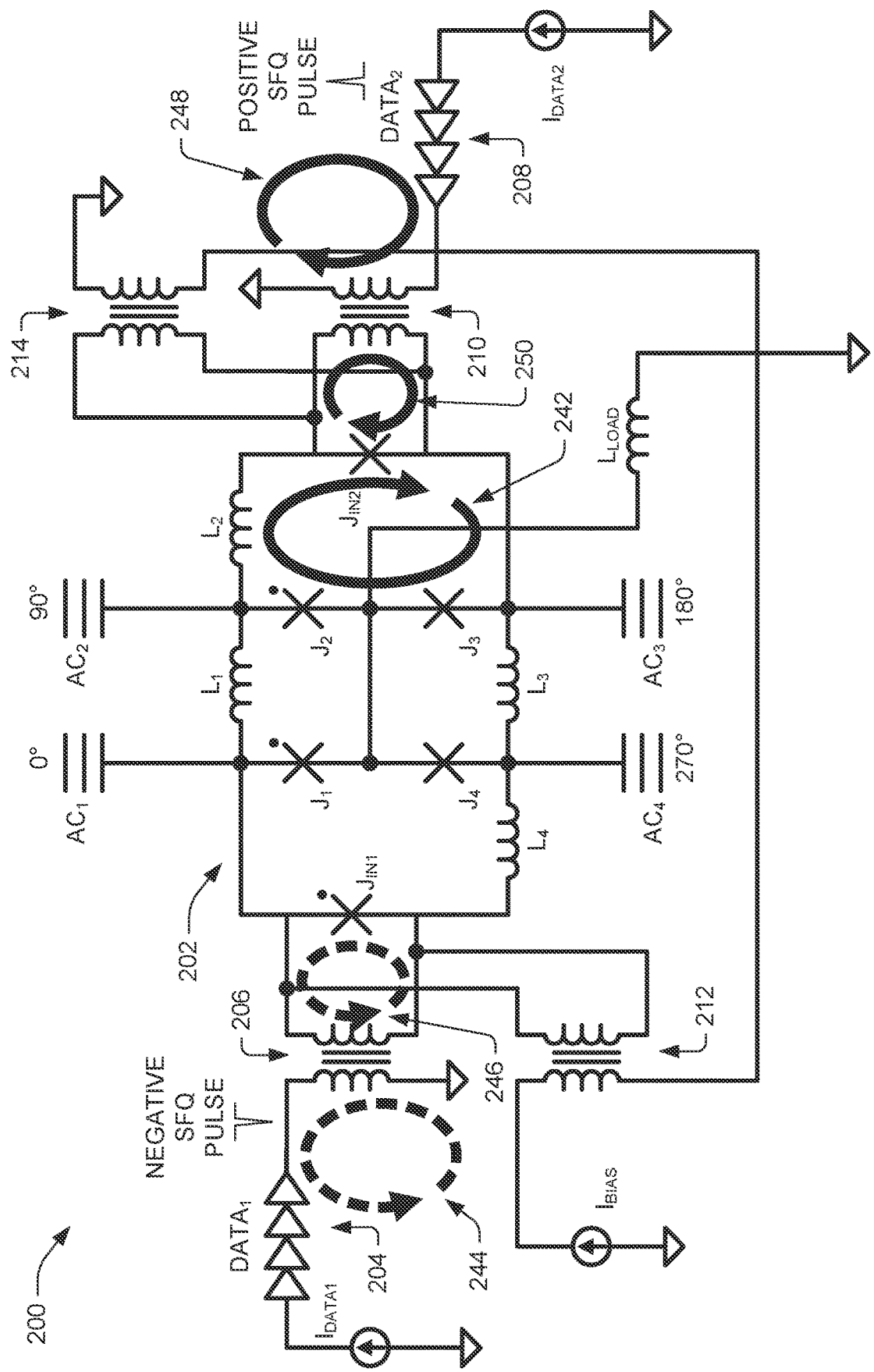

Given sufficient DC and AC biasing conditions for first ring JJ $J_1$, loop current 238, in combination with bias from 0° resonator tap $AC_1$, causes first ring JJ $J_1$ to trigger in the positive direction (toward the outside of the ring 202), advancing loop current 238 clockwise through the ring 202 as loop current 240, as shown in FIG. 2K. About one quarter of an AC clock cycle after the advancement through the ring 202 of loop current 238 (shown in FIG. 2J) as loop current 240 (shown in FIG. 2K), DC and AC biasing conditions can become sufficient for second ring JJ $J_2$ to trigger in the positive direction (toward the outside of the ring 202). Loop current 240, in combination with bias from 90° resonator tap $AC_2$, then causes second ring JJ $J_2$ to trigger, advancing loop current 240 clockwise through the ring 202 as loop current 242, as shown in FIG. 2L.

FIG. 2K also shows that about half an AC clock cycle after first input signal $DATA_1$ introduces loop current 234 and thereby induces loop current 236 via the introduction of a first SFQ pulse through first input JTLs 204, first input signal $DATA_1$ can introduce loop current 244 and thereby induce loop current 246 via the introduction of a second input SFQ pulse, which is reciprocal to the first input SFQ pulse, through first input JTLs 204. For example, if the first SFQ pulse (in FIG. 2I) is a positive SFQ pulse, the second, reciprocal SFQ pulse (in FIG. 2L) can be a negative SFQ pulse. However, biasing conditions at first injector JJ $J_{IN1}$ are not sufficient for admitting loop current 246 into the ring 202 at the time of FIG. 2K. Accordingly, loop currents 244, 246 remain in place, as shown in FIGS. 2L, 2M, 2N, and 2O.

Figure 2M:
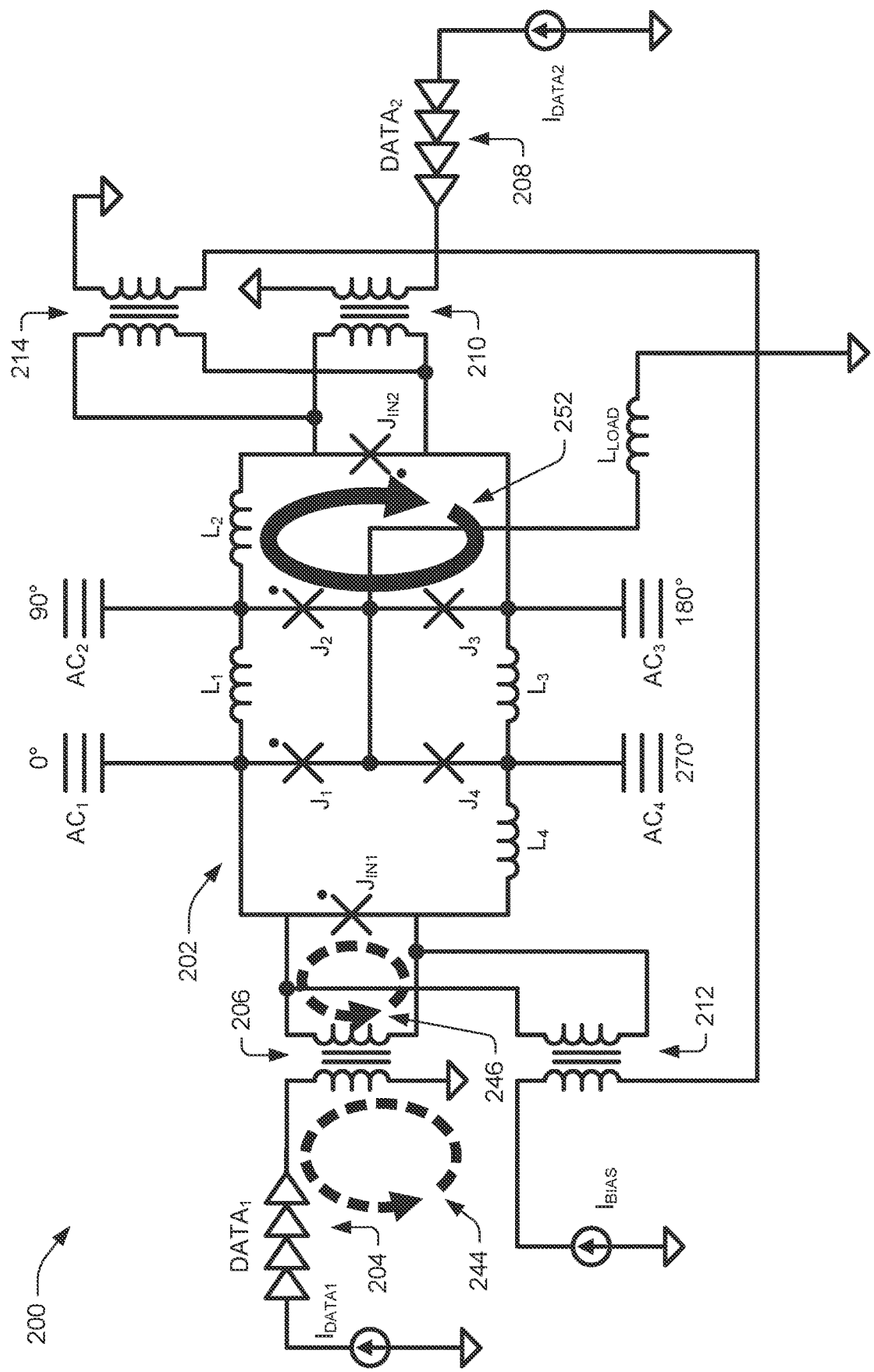

FIG. 2K further shows that, at about the same time that the first input signal $DATA_1$ introduces loop currents 244 and 246 via a negative SFQ pulse, second input signal $DATA_2$ can introduce loop current 248 and thereby induce loop current 250 via the introduction of a positive input SFQ pulse through second input JTLs 208. If the first positive SFQ pulse introduced by second input signal $DATA_2$ is provided earlier, e.g., at around the same time as the first positive SFQ pulse introduced by first input signal $DATA_1$ is provided (the time of FIG. 2I), then loop currents 248, 250 will remain in place and loop current 250 will not be admitted to the ring 202 until the time of FIGS. 2L and 2M, when biasing conditions at second injector JJ $J_{IN2}$ are sufficient. FIG. 2M thus shows the admission of loop current 250 into the ring 202 via the positive triggering of second injector JJ $J_{IN2}$, whereupon loop current 250 merges in superposition with loop current 242 to form loop current 252, which is illustrated in FIG. 2M with a doubly thick line representative of two single flux quanta worth of current, or what can be termed a double fluxon.

Figure 2N:
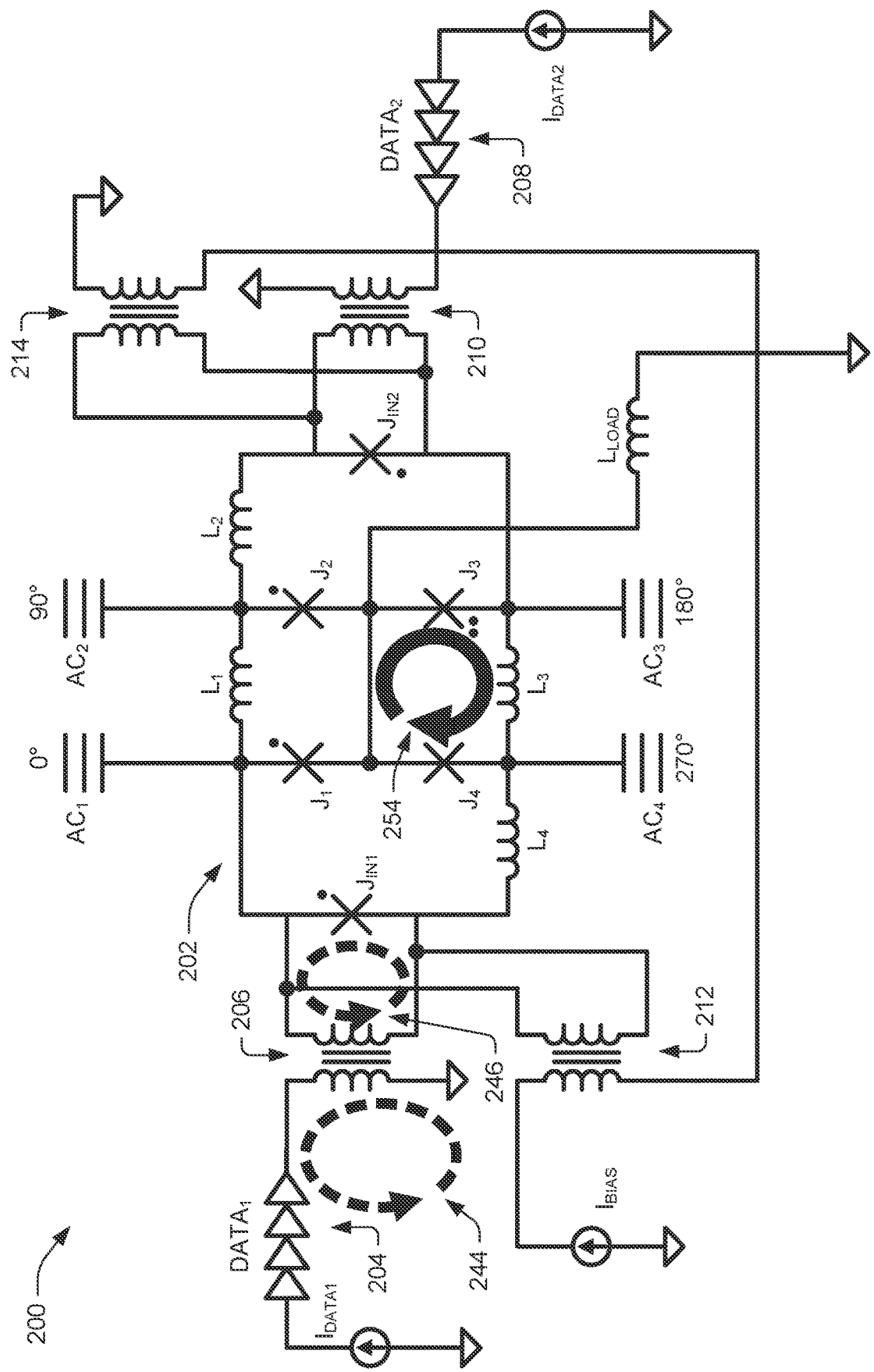

About a quarter of an AC clock cycle after the triggering of second ring JJ $J_2$, DC and AC biasing conditions for third ring JJ $J_3$, including bias contributions from 180° resonator tap $AC_3$ and loop current 252, can become sufficient to cause third ring JJ $J_3$ to doubly trigger in the positive direction (toward the outside of the ring 202), advancing loop current 252 clockwise through the ring 202 as loop current 254, as shown in FIG. 2N. For simplicity, FIG. 2N shows the net result of several successive triggerings of ring JJs $J_3$ and $J_4$, these several successive triggerings not being particularly illustrated.

Figure 2O:
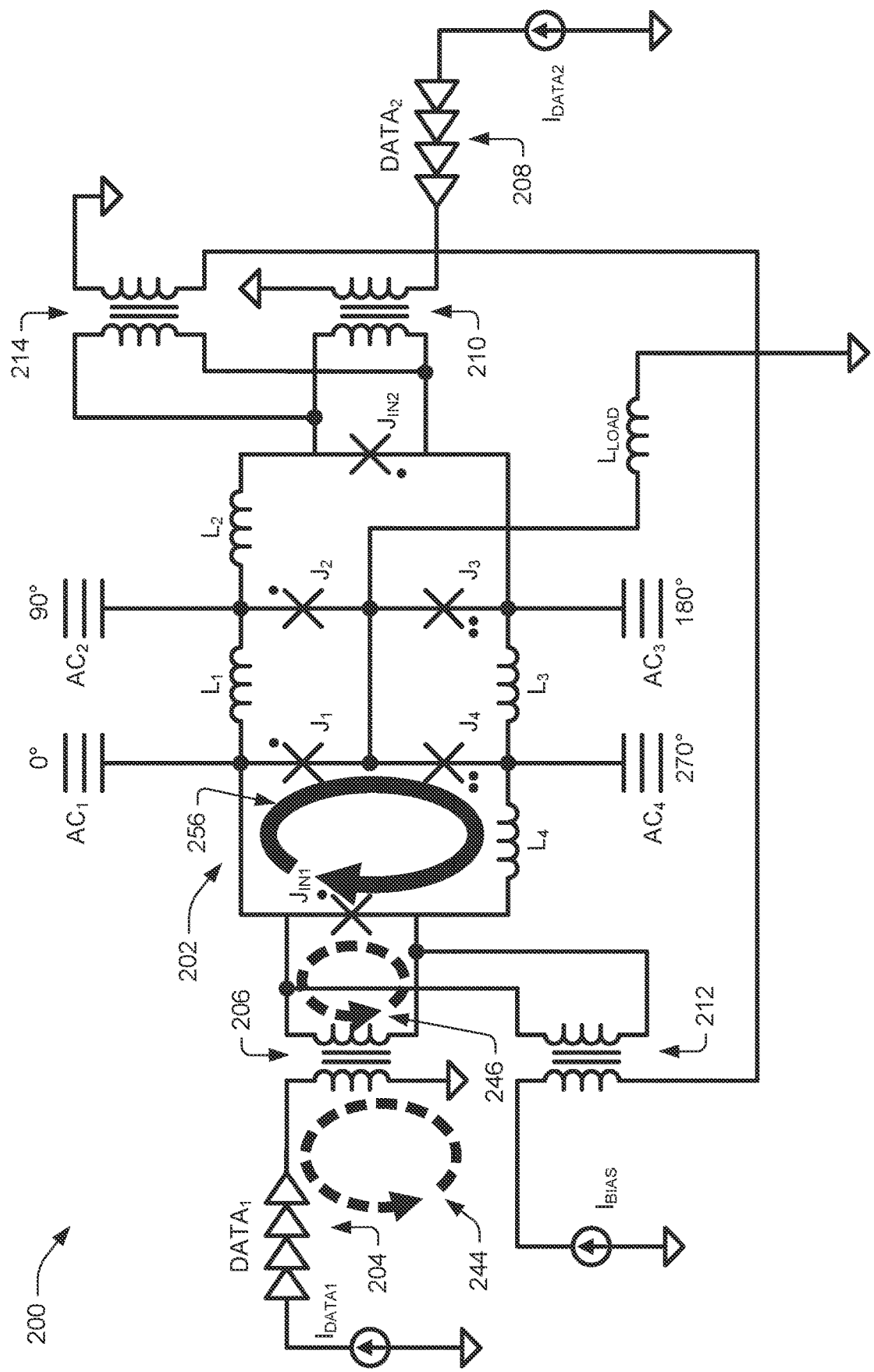
Figure 2P:
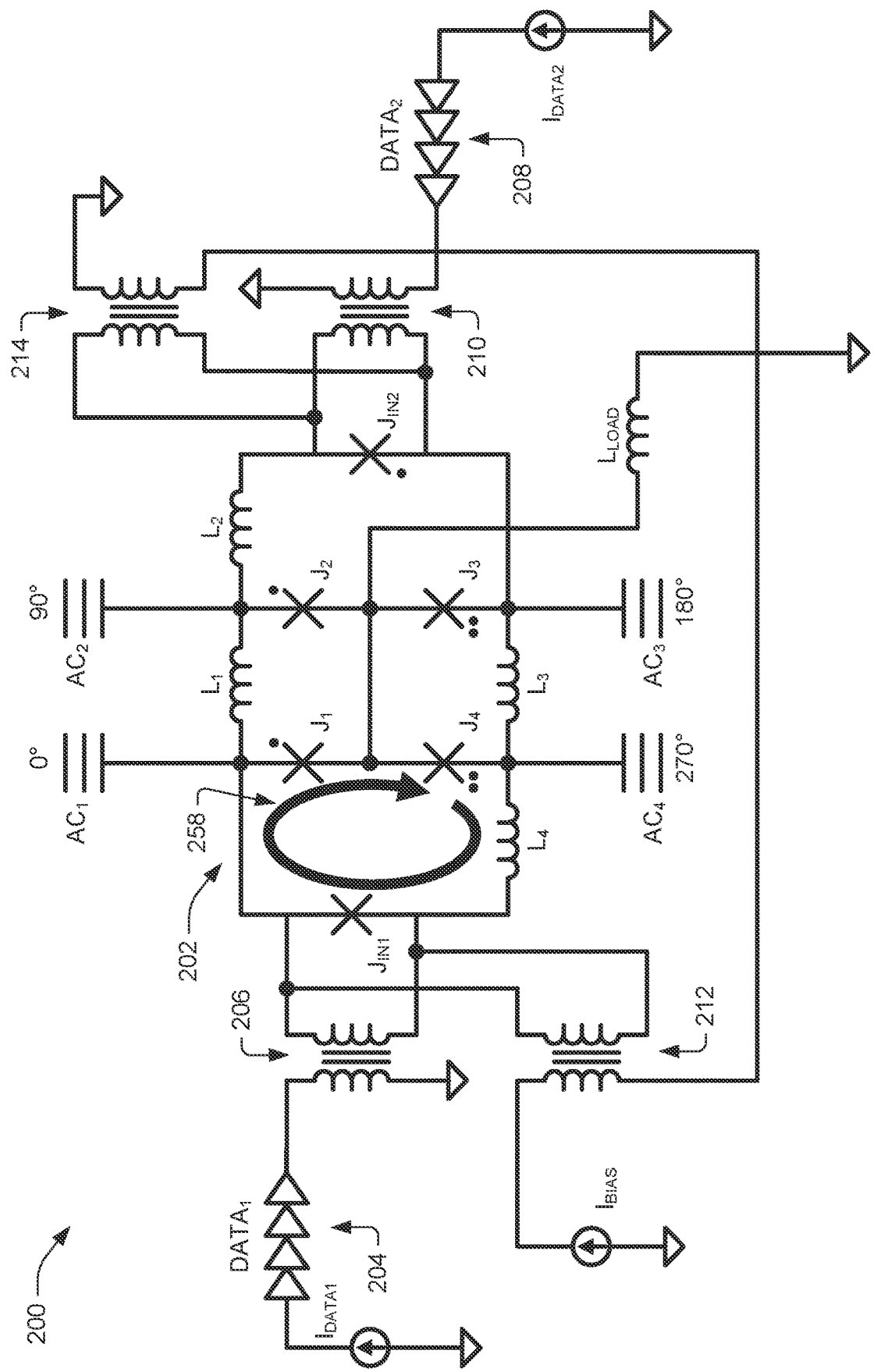

About one quarter of an AC clock cycle after the clockwise advancement through the ring 202 of loop current 252 (shown in FIG. 2M) as loop current 254 (shown in FIG. 2N), DC and AC biasing conditions for fourth ring JJ $J_4$, including bias contributions from 270° resonator tap $AC_4$ and loop current 254, can become sufficient for fourth ring JJ $J_4$ to doubly trigger in the positive direction (toward the outside of the ring 202), advancing loop current 254 clockwise through the ring 202 as loop current 256, as shown in FIG. 2O. For simplicity, FIG. 2O shows the net result of several successive triggerings of ring JJ $J_4$ and first injector JJ $J_{IN1}$, these several successive triggerings not being particularly illustrated.

Substantially contemporaneously, loop currents 246 and 256 cause bias conditions favorable for the untriggering (triggering in a negative direction opposite that of an initial triggering) of first injector JJ $J_{IN1}$. First injector JJ $J_{IN1}$ is thus returned to a 0 radian phase from a $2\pi$ radian phase. Two consequences result from the untriggering of first injector JJ $J_{IN1}$ in the illustrated example. One consequence is that loop current 246 and its inductive counterpart loop current 244, held in their respective places in the circuit 200 since the time of FIG. 2K, are annihilated. Another consequence is that one single flux quantum worth of current in loop current 256 is also annihilated, reducing the double-fluxon loop current 256 to the single-fluxon loop current 258 shown in FIG. 2P. The illustrated example, however, shows first input signal $DATA_1$ staying logical high for only one AC clock cycle. In examples in which first input signal $DATA_1$ were to stay logical high for a subsequent AC clock cycle, the double-fluxon loop current 256 would not be reduced to a single-fluxon loop current at the time of FIG. 2P, but instead would continue to propagate clockwise around the ring 202 as a double fluxon loop current.

Figure 2Q:
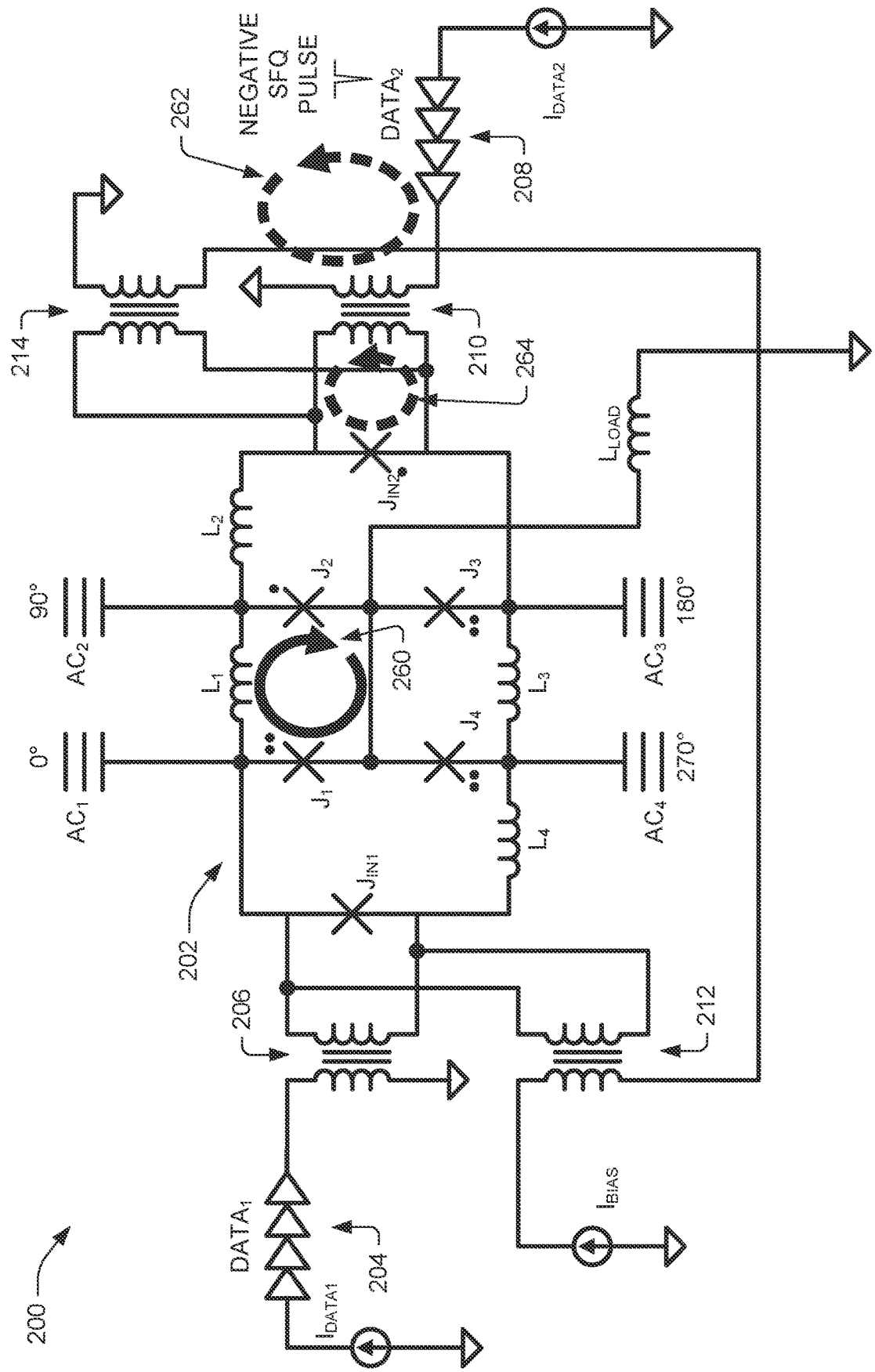

About one quarter of an AC clock cycle after the clockwise advancement through the ring 202 of loop current 254 (shown in FIG. 2N) as loop current 256 (shown in FIG. 2O), DC and AC biasing conditions can become sufficient for first ring JJ $J_1$ to again trigger in the positive direction (toward the outside of the ring 202). Loop current 258, in combination with bias from 0° resonator tap $AC_1$, thus causes first ring JJ $J_1$ to trigger, placing first ring JJ $J_1$ in a $2\pi$ radian phase and advancing loop current 258 clockwise through the ring 202 as loop current 260, as shown in FIG. 2Q. FIG. 2Q also shows that about half an AC clock cycle after second input signal $DATA_2$ introduces loop current 248 and thereby induces loop current 250 via the introduction of a first SFQ pulse through second input JTLs 208, second input signal $DATA_2$ can introduce loop current 262 and thereby induce loop current 264 via the introduction of a second input SFQ pulse, which is reciprocal to the first input SFQ pulse, through second input JTLs 208. For example, if the first SFQ pulse (in FIG. 2K) is a positive SFQ pulse, the second, reciprocal SFQ pulse (in FIG. 2Q) can be a negative SFQ pulse. However, biasing conditions at second injector JJ $J_{IN2}$ are not sufficient for admitting loop current 264 into the ring 202 at the time of FIG. 2Q. Accordingly, loop currents 262, 264 remain in place, as shown in FIG. 2R.

Figure 2R:
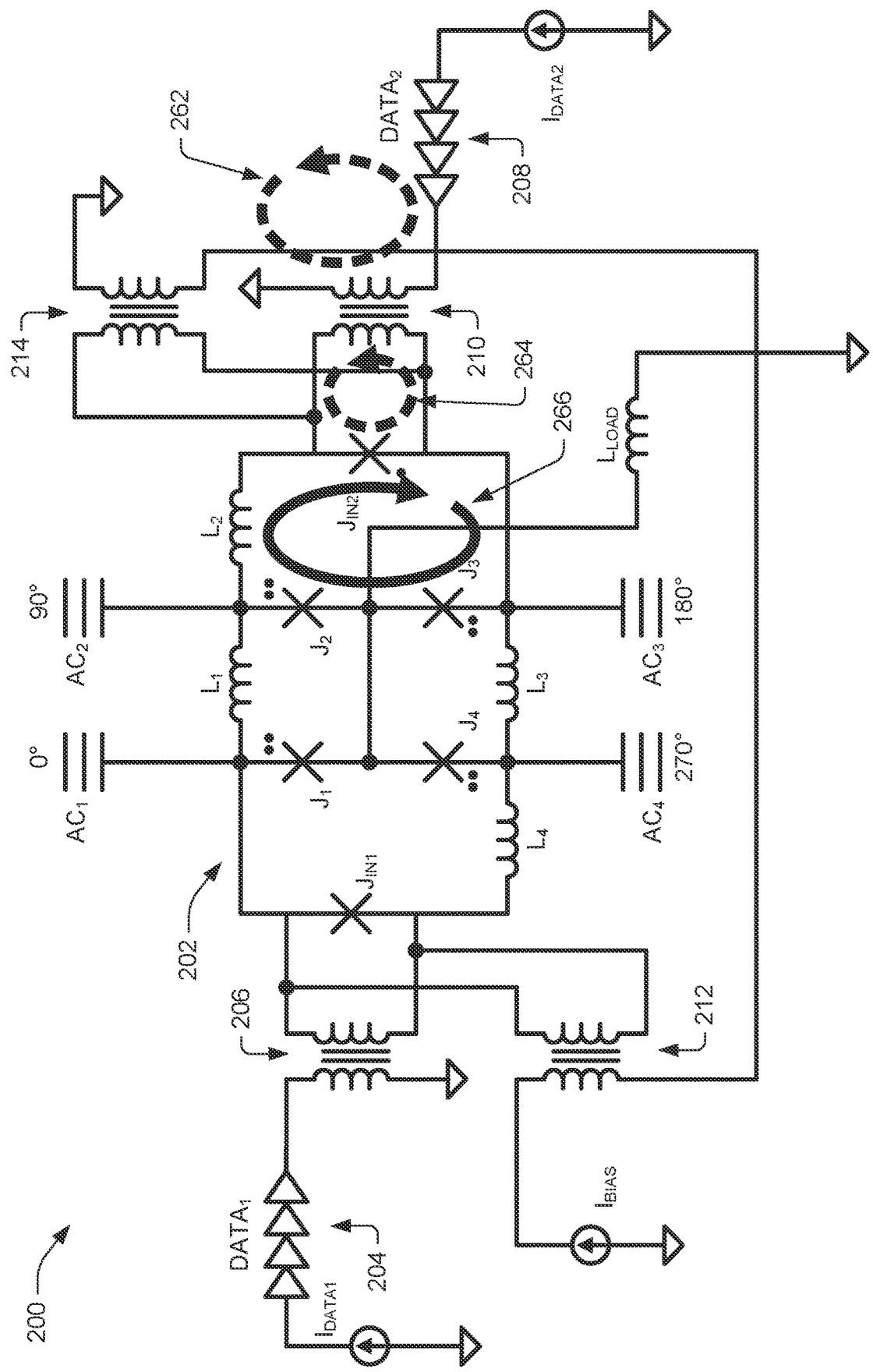

About one quarter of an AC clock cycle after the clockwise advancement through the ring 202 of loop current 258 (shown in FIG. 2P) as loop current 260 (shown in FIG. 2Q), DC and AC biasing conditions for second ring JJ $J_2$, including bias contributions from 90° resonator tap $AC_2$ and loop current 260, can become sufficient for second ring JJ $J_2$ to trigger in the positive direction (toward the outside of the ring 202), advancing loop current 260 clockwise through the ring 202 as loop current 266, as shown in FIG. 2R.

Figure 2S:
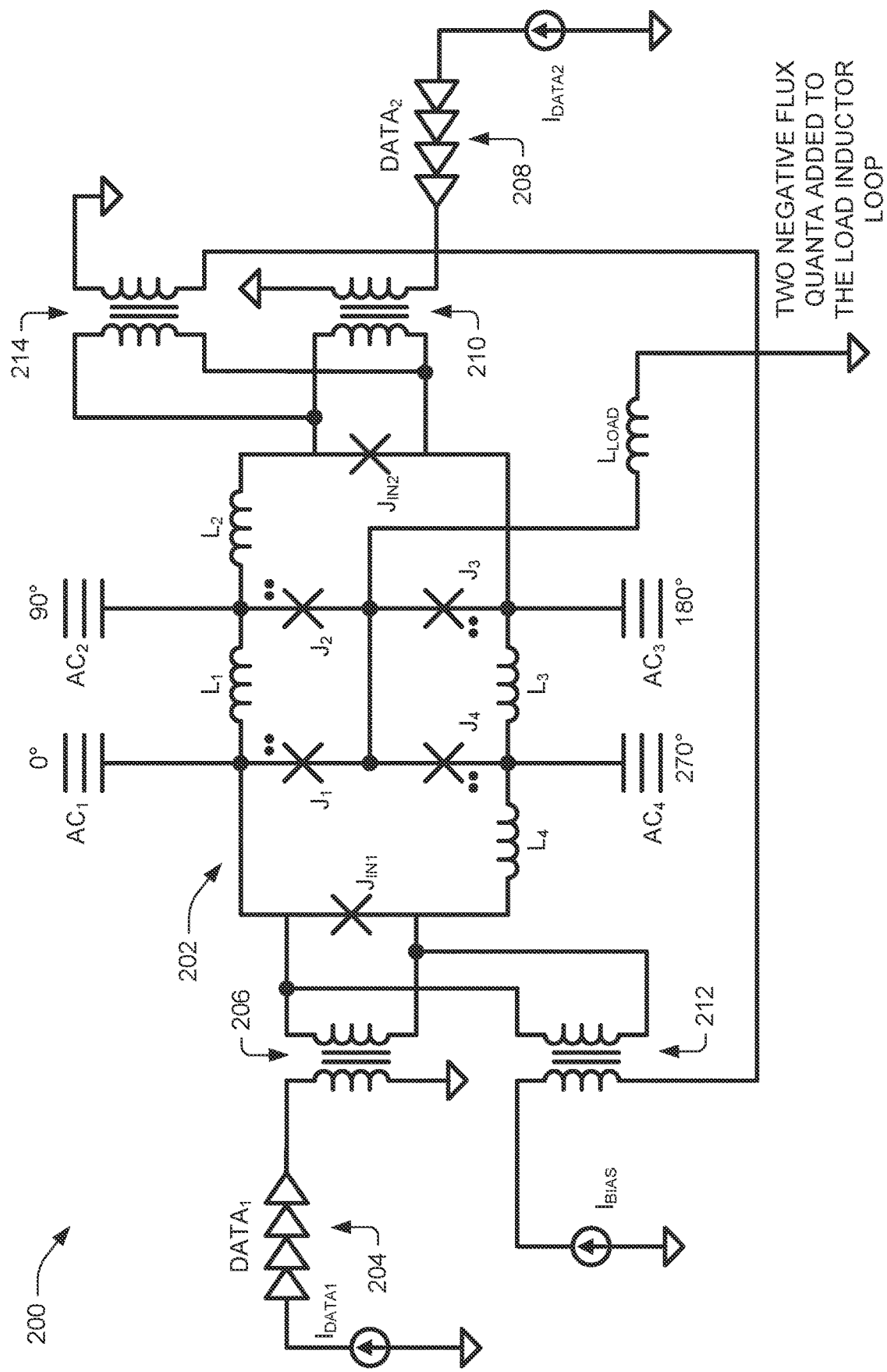

Substantially contemporaneously, loop currents 262 and 264 cause bias conditions favorable for the untriggering (triggering in a negative direction opposite that of an initial triggering) of second injector JJ $J_{IN2}$. Second injector JJ $J_{IN2}$ is thus returned to a 0 radian phase from a $2\pi$ radian phase. Two consequences result from the untriggering of second injector JJ $J_{IN2}$ in the illustrated example. One consequence is that loop current 264 and its inductive counterpart loop current 262 are annihilated. Another consequence is that loop current 266 is also annihilated, resulting in the state shown in FIG. 2S. FIG. 2S shows that all four ring JJs $J_1$, $J_2$, $J_3$, and $J_4$ reside at $2\pi$ radian phase at two negative flux quanta have been added to the load inductor loop.

With each clockwise advance of the loop current 238, 240, 242, 252, 254, 256, 258, 260, 266 through the ring 202, more flux is stored by load inductor $L_{LOAD}$. Flux is stored in load inductor $L_{LOAD}$ in the example of FIGS. 2I through 2S at twice the rate of the example of FIGS. 2B through 2H because both input signals $DATA_1$, $DATA_2$ are logical high in the example of FIGS. 2I through 2S, and thus both injector JJs $J_{IN1}$, $J_{IN2}$ admit flux to the ring 202 in the example of FIGS. 2I through 2S, as opposed to only one injector JJ $J_{IN1}$ admitting flux to the ring 202 in the example of FIGS. 2B-2H. If data input signals $DATA_1$, $DATA_2$ remain logical high, the cycle of flux admission and propagation through the ring 202 repeats, accumulating more flux in the load inductor $L_{LOAD}$, until compliance of the ring 202 is reached. If, however, one of the data input signals $DATA_1$ or $DATA_2$ becomes logical low, the rate of flux admission to the ring, and thus the rate of flux accumulation in the load inductor $L_{LOAD}$, becomes halved as compared to when both flux injectors are activated. In the case that both data input signals $DATA_1$, $DATA_2$ become logical low, no further flux is admitted to the ring 202 by the injector JJs $J_{IN1}$, $J_{IN2}$ and no further flux is accumulated in the load inductor $L_{LOAD}$.

In the above-illustrated examples of the functioning of circuit 200, flux can be continually injected into the ring 202 by injector JJs $J_{IN1}$, $J_{IN2}$ until the compliance of the ring 202 is reached. With each AC clock cycle, ring JJs $J_1$, $J_2$, $J_3$, $J_4$ trigger in sequence, causing one or more flux quanta to advance around the ring 202 until the entirety of each flux quantum is loaded into load inductor $L_{LOAD}$. Because the load inductor $L_{LOAD}$ couples to all of the ring JJs $J_1$, $J_2$, $J_3$, $J_4$ at the same electrical node, every time a ring JJ is triggered for a $2\pi$ radian advance in phase, one quarter of a flux quantum's worth of circulating current is provided through the load inductor $L_{LOAD}$. When propagated flux makes a complete circuit around the ring 202 of the flux-pump DAC circuit 200, one whole flux quantum is provided in the load inductor $L_{LOAD}$. Although the examples illustrated in FIGS. 2B through 2S illustrate flux being injected into the ring 202 with positive SFQ pulses on a positive phase of the AC clock and with negative SFQ pulses on a negative phase of the AC clock, in other examples, not illustrated, flux can be injected into the ring 202 only with positive SFQ pulses on the positive phase of the AC clock or only with negative SFQ pulses on the negative phase of the AC clock, with adjustments to bias current $I_{BIAS}$. Negative-clock-phase, negative-SFQ-pulse injection can inject energy into the flux-pump DAC circuit 200 in similar fashion as positive-clock-phase, positive-SFQ-pulse injection and can likewise increase the flux stored by load inductor $L_{LOAD}$. In some examples, not illustrated, logical high data signals can be provided by both data input signals $DATA_1$, $DATA_2$ to inject two flux quanta into the ring 202 during a same clock cycle, 180° out of phase with each other.

Figure 2T:
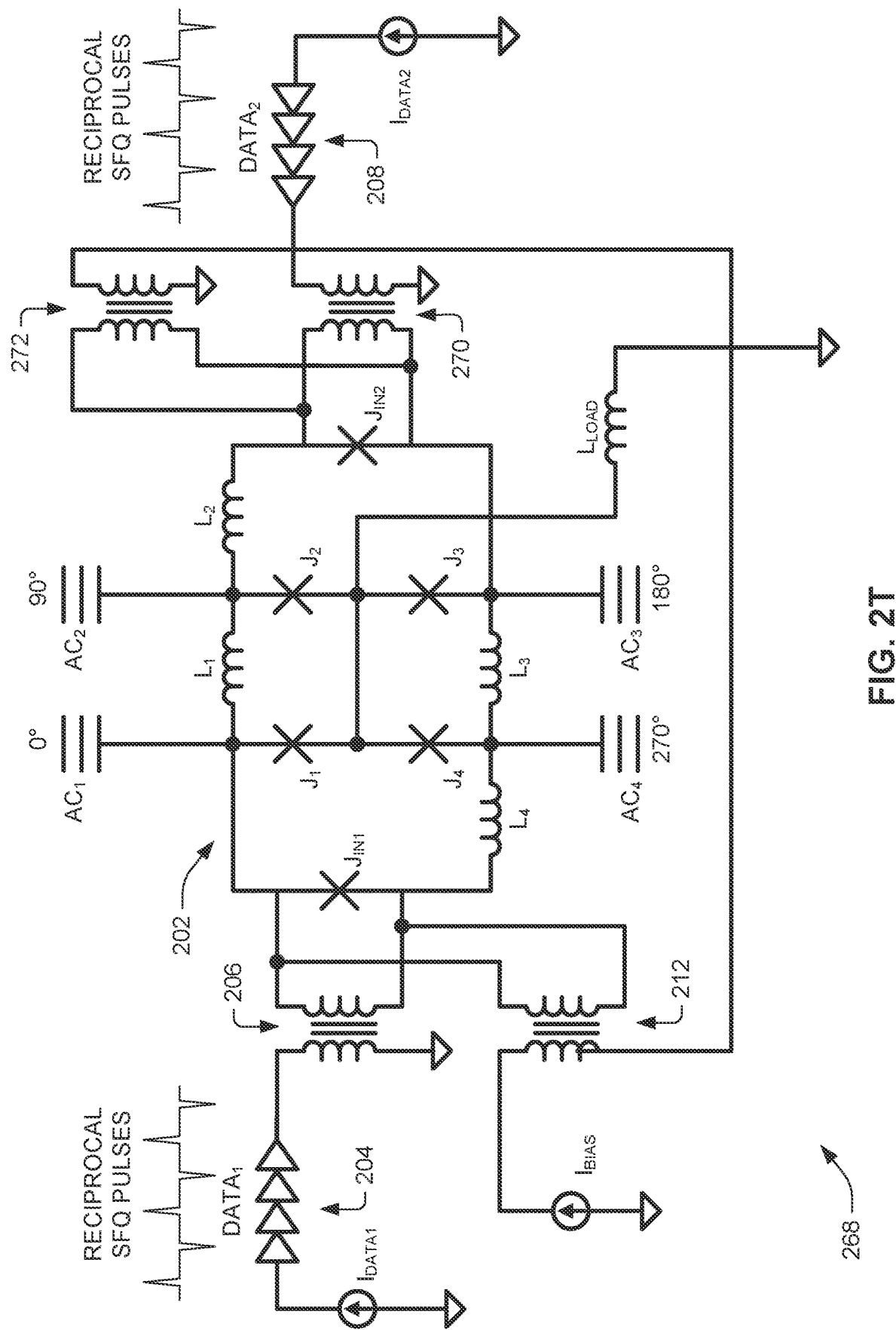
FIG. 2T is a circuit diagram of an example flux-pump DAC with multi-flux quantum injection having two flux injectors in a pump ring, one configured for loading and one configured for loading and one configured for unloading of flux in a load inductor.

Example circuit 268 of FIG. 2T is like circuit 200 of FIG. 2A, with a first input (providing first input signal $DATA_1$) configured for controllably loading flux into a flux-pump DAC, except that its second input (providing second input signal $DATA_2$) is configured for controllably unloading flux from the flux-pump DAC by reversing the input polarities of primary-side inductors on each of second data input transformer 270 (corresponding to second data input transformer 210 of circuit 200) and second DC bias transformer 272 (corresponding to second DC bias transformer 214 of circuit 200). In some examples, the second input can be used to controllably load the load inductor with flux, and the first input can be used to controllably unload the load inductor.

Figure 2U:
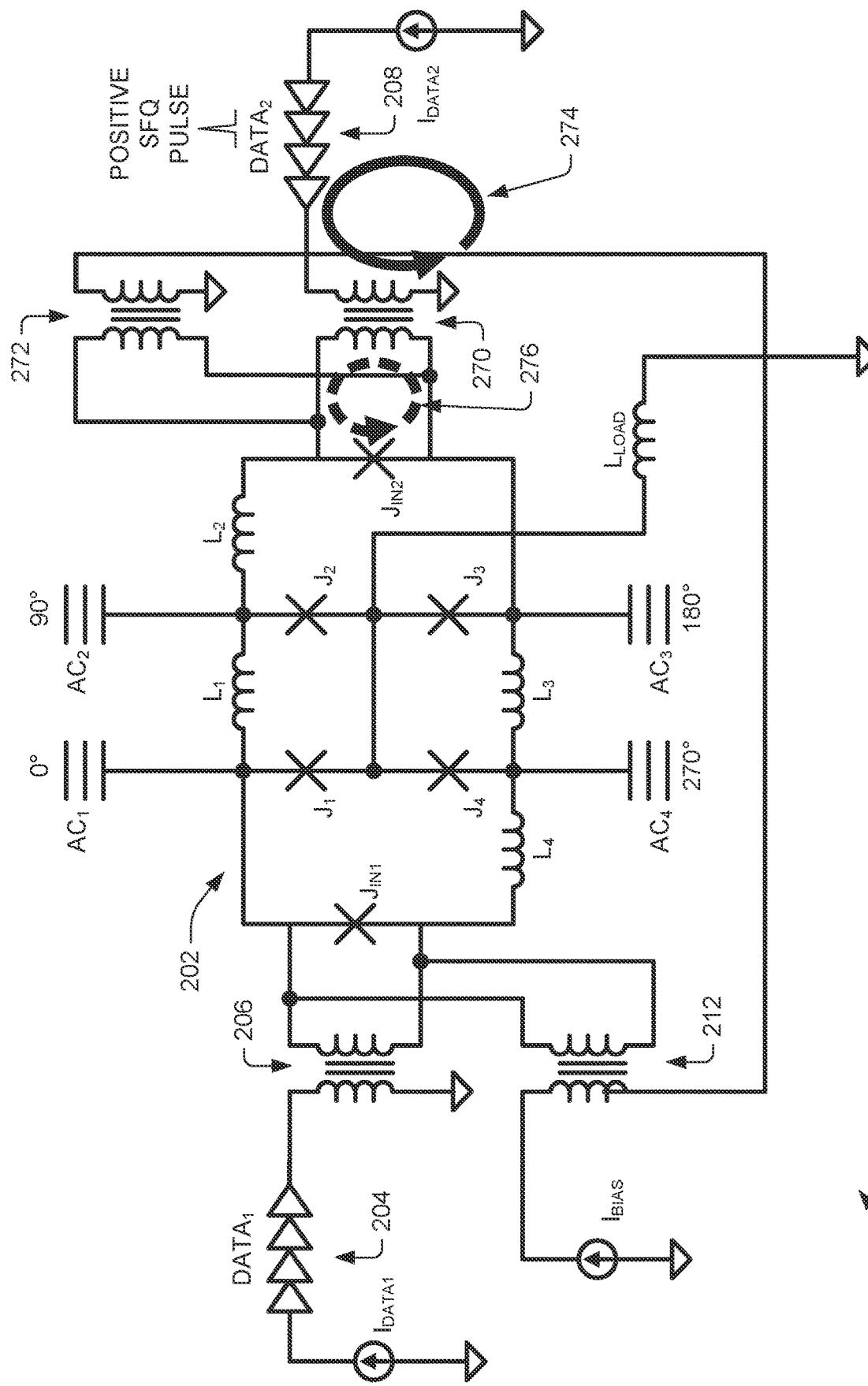
FIGS. 2U through 2Z are circuit diagrams showing example functioning of the flux-pump DAC of FIG. 2T with one flux injector activated, e.g., to unload flux earlier loaded onto the load inductor by the other flux injector.
Figure 2V:
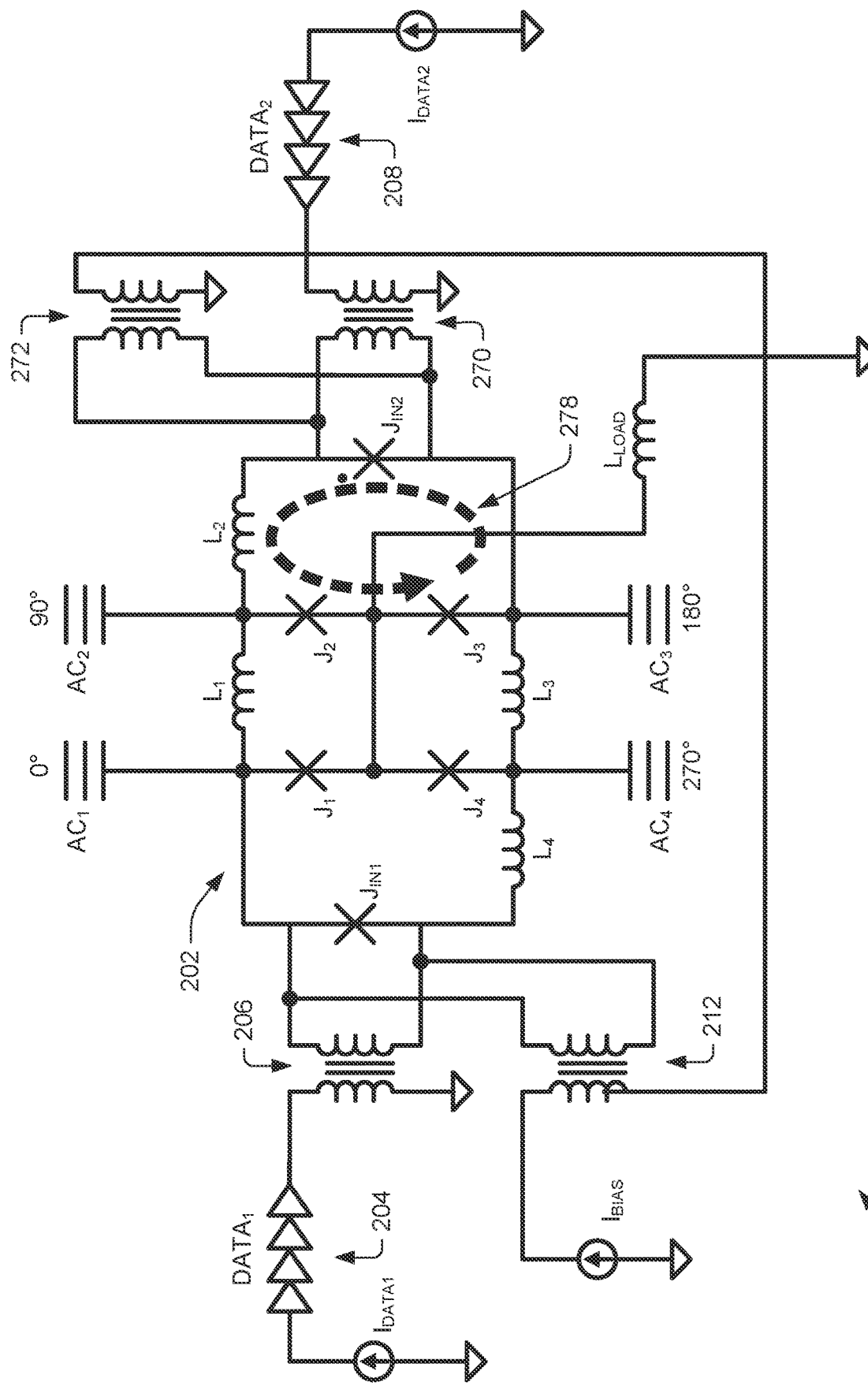

FIGS. 2U through 2Z illustrate the functioning of the circuit 268 of FIG. 2T when flux is injected into the ring 202 by only the second flux injector JJ $J_{IN2}$ responsive to a logical high WPL SFQ pulse input by second data input signal $DATA_2$ via second input JTLs 208 and second input transformer 270. In the example of FIGS. 2U through 2Z, flux is not also injected into the ring 202 by the first flux injector JJ $J_{IN1}$. FIG. 2U shows superconducting loop current 274 output from the second input JTLs 208 as a result of introduction of a positive SFQ pulse on the second data input $DATA_2$. Superconducting loop current 274 induces loop current 276 via second input transformer 270. Given sufficient DC and AC biasing conditions for second injector JJ $J_{IN2}$, loop current 276 causes second injector JJ $J_{IN2}$ to trigger in the negative direction, propagating loop current 276 into the ring 202 as loop current 278, as shown in FIG. 2V. The second injector JJ $J_{IN2}$ thus admits one negative flux quantum into the ring 202 while also annihilating the loop current 276 circulating in the loop that includes the secondary inductor of the second input transformer 270 and the second injector JJ $J_{IN2}$.

Figure 2W:
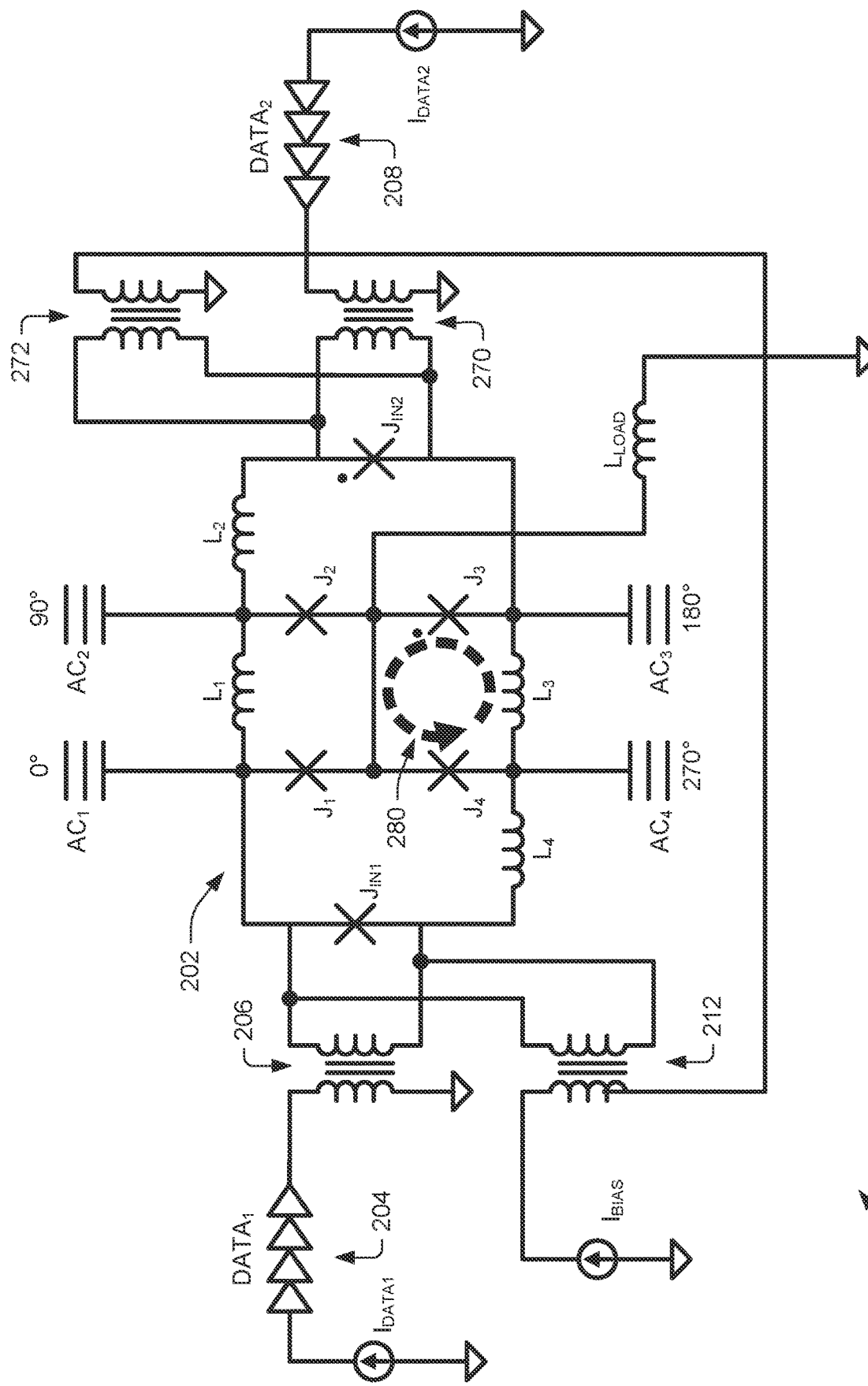

Given sufficient DC and AC biasing conditions for third ring JJ $J_3$, loop current 278, in combination with bias from 180° resonator tap $AC_3$, causes third ring JJ $J_3$ to trigger in the negative direction (toward the inside of the ring 202), advancing loop current 278 clockwise through the ring 202 as loop current 280, as shown in FIG. 2W.

Figure 2X:
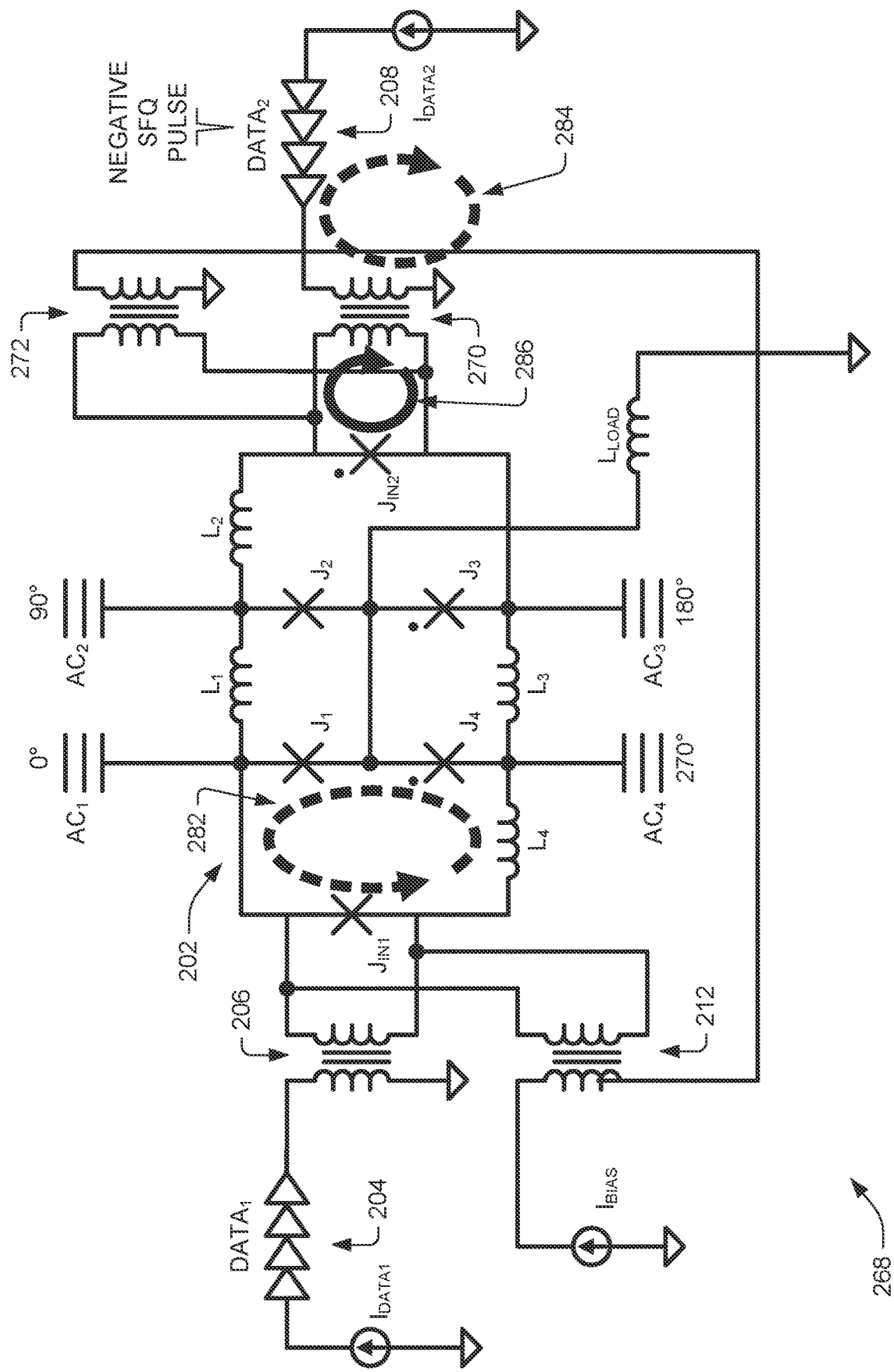
Figure 2Y:
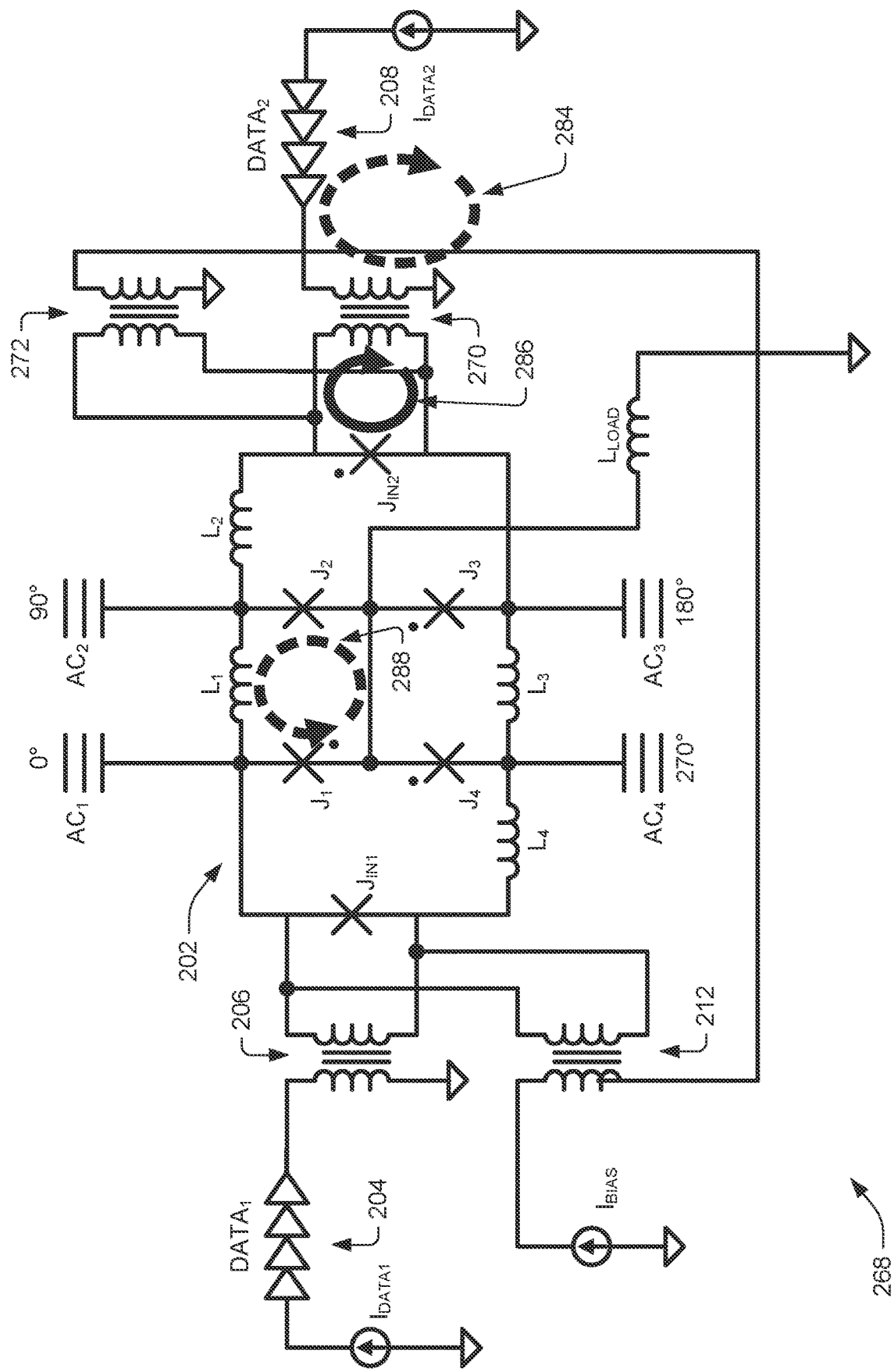

About one quarter of an AC clock cycle after the advancement through the ring 202 of loop current 278 (shown in FIG. 2V) as loop current 280 (shown in FIG. 2W), DC and AC biasing conditions can become sufficient for fourth ring JJ $J_4$ to trigger in the negative direction (toward the inside of the ring 202). Loop current 280, in combination with bias from 270° resonator tap $AC_4$, then causes fourth ring JJ $J_4$ to trigger negatively, advancing loop current 280 clockwise through the ring 202 as loop current 282, as shown in FIG. 2X. FIG. 2X also shows that about half an AC clock cycle after second input signal $DATA_2$ introduces loop current 274 and thereby induces loop current 276 via the introduction of a first SFQ pulse through second input JTLs 208, second input signal $DATA_2$ can introduce loop current 284 and thereby induce loop current 286 via the introduction of a second input SFQ pulse, which is reciprocal to the first input SFQ pulse, through second input JTLs 208. For example, if the first SFQ pulse (in FIG. 2U) is a positive SFQ pulse, the second, reciprocal SFQ pulse (in FIG. 2X) can be a negative SFQ pulse. However, biasing conditions at second injector JJ $J_{IN2}$ are not sufficient for admitting loop current 286 into the ring 202 at the time of FIG. 2X. Accordingly, loop currents 284, 286 remain in place, as shown in FIG. 2Y.

About another quarter of an AC clock cycle after loop current 280 is advanced clockwise through the ring 202 as loop current 282, DC and AC biasing conditions become sufficient for first ring JJ $J_2$ to trigger in the negative direction (toward the inside of the ring 202). Loop current 282, in combination with bias from 0° resonator tap $AC_1$, then causes first ring JJ $J_1$ to trigger, advancing loop current 282 clockwise through the ring 202 as loop current 288, as shown in FIG. 2Y.

Figure 2Z:
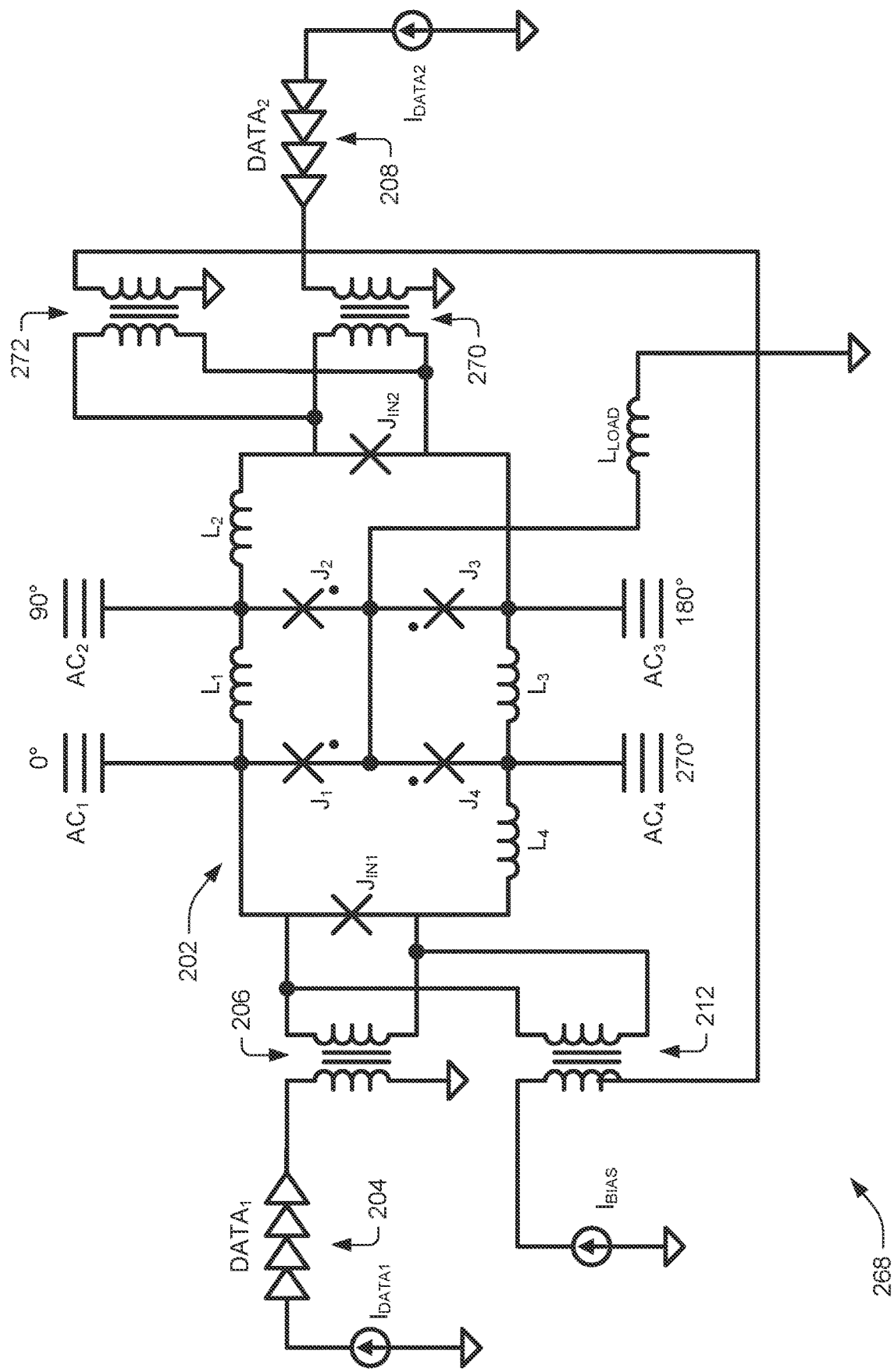

About another quarter of an AC clock cycle later, DC and AC biasing conditions become sufficient for second ring JJ $J_2$ to trigger in the negative direction (toward the inside of the ring 202). Loop current 288, in combination with bias from 90° resonator tap $AC_2$, then causes second ring JJ $J_2$ to trigger, advancing loop current 288 clockwise through the ring 202 as a loop current that is not shown in FIG. 2Z, because it is annihilated by the untriggering (positive triggering) of second injector JJ $J_{IN2}$. The untriggering of second injector JJ $J_{IN2}$ also annihilates loop currents 286 and 284. The resultant circuit state is shown in FIG. 2Z, in which there remain no more substantial loop currents within the ring 202, and all ring JJs $J_1$, $J_2$, $J_3$, $J_4$ have been set at negative $2\pi$ radian phase.

With each advance of the loop currents 278, 280, 282, 288 through the ring 202 in each of FIGS. 2U through 2Z, more positive flux is stored by load inductor $L_{LOAD}$ (the positive sign of the flux being defined by the current flowing through the load inductor $L_{LOAD}$ from the center of the ring 202 towards ground). If second data input signal $DATA_2$ remains logical high (e.g., if reciprocal SFQ pulses continue to be introduced through second input JTLs 208), the cycle of flux admission and propagation through the ring 202 (as shown in FIGS. 2U through 2Z) repeats, accumulating more positive flux in the load inductor $L_{LOAD}$, until compliance of the ring 202 is reached. If, however, second data input signal $DATA_2$ is not logical high, no further flux is admitted to the ring 202 and no further positive flux is accumulated in the load inductor $L_{LOAD}$.

In some examples, the process of FIGS. 2U through 2Z can be used to unload negative flux previously stored on the load inductor $L_{LOAD}$, e.g., by the process of FIGS. 2B through 2H. In other examples, the process of FIGS. 2U through 2Z can be used to load a precisely controlled amount of positive flux onto the load inductor $L_{LOAD}$. Subsequent to the loading of the load inductor $L_{LOAD}$ with a desired amount of positive flux, the load inductor $L_{LOAD}$ can be, e.g., transformer-coupled to another portion of RQL circuitry on the same IC as circuit 268, transferring the positive flux stored in the load inductor $L_{LOAD}$ to the other portion of RQL circuitry and thus unloading the positive flux that had been accumulated to a precisely desired amount on the load inductor $L_{LOAD}$.

In some examples (not shown), circuits 200 of FIG. 2A and 268 of FIG. 2T can be combined, for example, by providing two second data input paths—one for loading and one for loading, and providing second data input transformer 210 or 270 as a triple-inductor transformer that couples into the flux-pump DAC both the loading and unloading inputs.

The example circuits 200, 268 of FIGS. 2A and 2U each have only four ring JJs, only two injector JJs, and only use four phases of the AC clock, the AC clock phases separated from each other by about 90°. The example circuits 200 268 of FIGS. 2A and 2U consequently can load between zero and two flux quanta onto the load inductor $L_{LOAD}$ in a single AC clock cycle, in the illustrated examples. Other example flux-pump DAC circuits can include more than four ring JJs, can include more than two injector JJs, and/or can use more than four phases of the AC clock, the AC clock phases separated from each other by less than about 90°. For example, a flux-pump DAC having eight ring JJs and four injector JJs (not shown) can have each of its ring JJs biased by 45°-separated phases of the AC clock. Such an example circuit can thus permit for between zero and four flux quanta to be injected into its ring in a single AC clock cycle. The flux quanta injected into the ring of such an example circuit can be separated from each other by 45°-phase-separated ring JJs, such that the injected flux quanta can all be propagated around the ring without interfering with each other.

Figure 3:
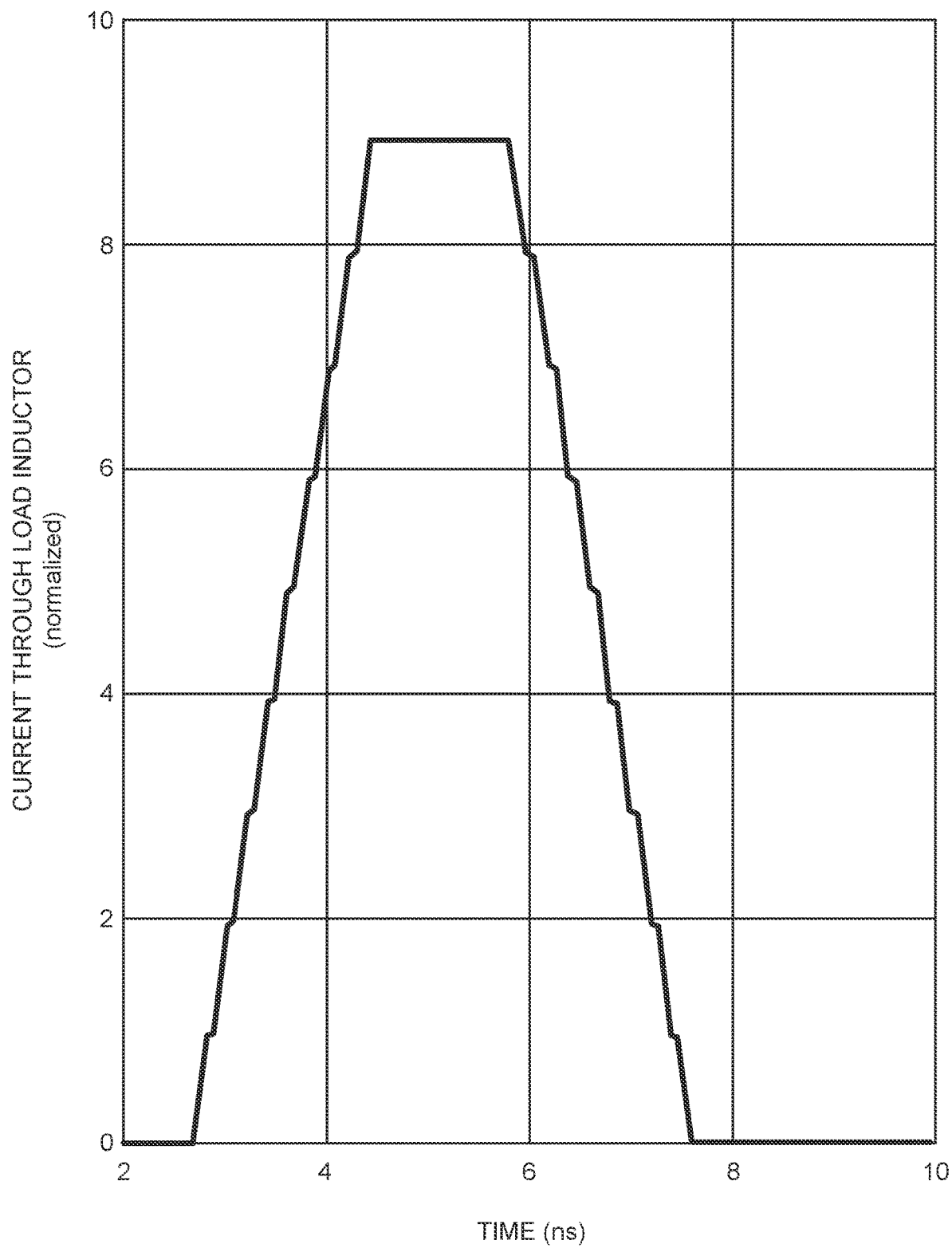
FIG. 3 is a graph of example flux accumulation using the flux-pump DAC of FIG. 2T.

FIG. 3 shows a graph of example current through the load inductor $R_{LOAD}$ in the circuit 268 of FIG. 2T with respect to time for an AC clock run continuously from time 0 to time 10 nanoseconds with an AC clock frequency of, for example, about 5 gigahertz. First input signal $DATA_1$ is set at logical high between about 2.75 nanoseconds and about 4.25 nanoseconds to precisely controllably load negative flux onto the load inductor $L_{LOAD}$. Second input signal $DATA_2$ is set at logical high between about 5.8 nanoseconds and about 7.75 nanoseconds to precisely controllably unload negative flux from the load inductor $L_{LOAD}$. Before about 2.75 nanoseconds, after about 7.75 nanoseconds, and between about 4.25 nanoseconds and about 7.75 nanoseconds, both input signals $DATA_1$, $DATA_2$ are set at logical low. FIG. 3 thus shows that when data is applied to the input of a first injector (e.g., JJ $J_{IN1}$ in FIG. 2T), the flux-pump DAC 268 takes one step up (loads one negative flux quantum onto its load inductor $L_{LOAD}$) each clock cycle, and when data is applied to the input of a second injector (e.g., $J_{IN2}$ in FIG. 2T) with data input to its first injector turned off, the flux-pump DAC 268 takes one step down (unloads one negative flux quantum from its load inductor $L_{LOAD}$) each clock cycle. A four-injector flux-pump DAC (not shown) can operate at twice the maximum flux loading rate of the two-injector flux-pump DAC 268 and thus can take the DAC up or down two steps per clock cycle.

Figure 4:
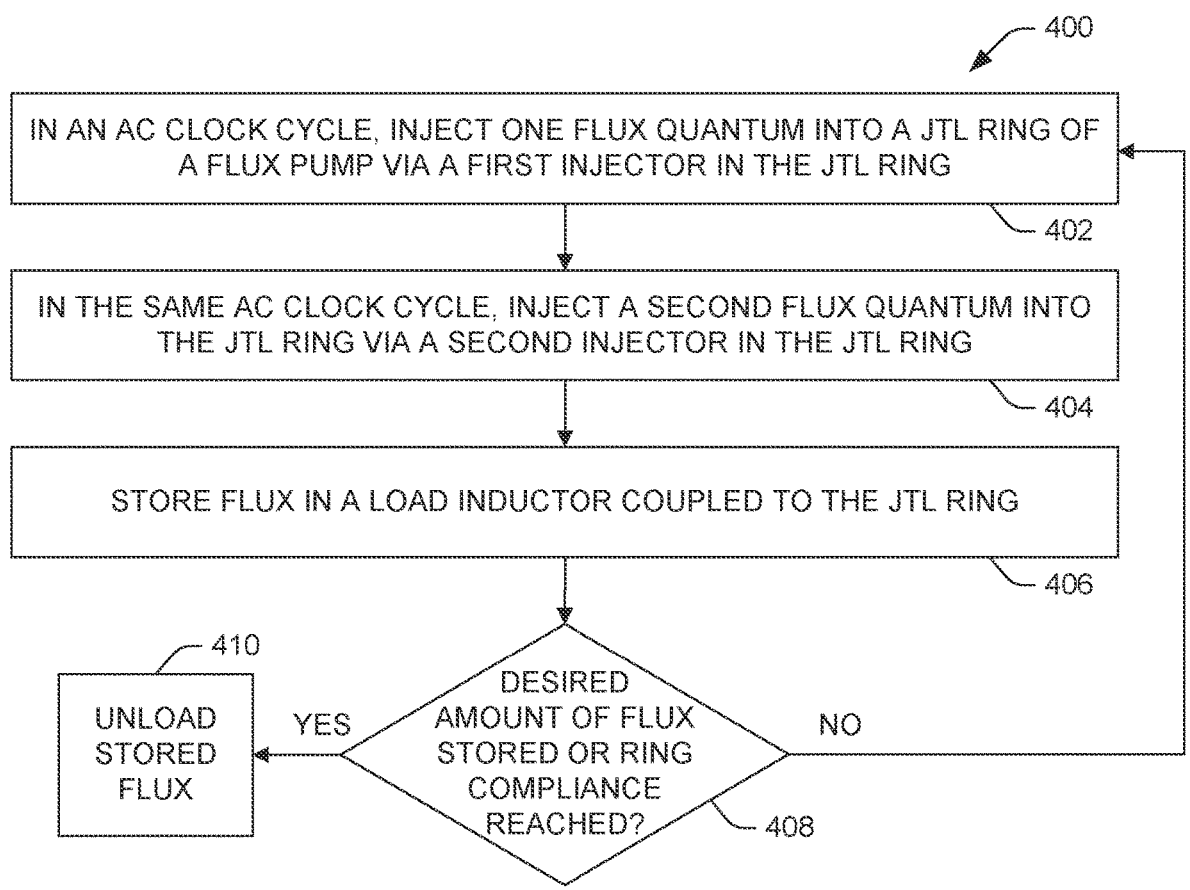
FIG. 4 is a flow chart showing an example method of multi-flux quantum injection in a flux-pump DAC.

FIG. 4 illustrates a method 400 of multi-flux quantum injection in a flux-pump DAC. In an AC clock cycle (e.g., of an AC clock of an RQL system), one flux quantum is injected 402 into a JTL ring of a flux pump via a first injector in the JTL ring. The JTL ring can comprise, for example, at least four JJs (e.g., ring JJs $J_1$, $J_2$, $J_3$, and $J_4$ in FIG. 2A). The first injector can, for example, comprise a first injector JJ (e.g., JJ $J_{IN1}$ in FIG. 2A) in the JTL ring, and can further comprise associated transformer circuitry (e.g., transformer 206 in FIG. 2A) and/or data provision circuitry (e.g., JTLs 204 in FIG. 2A). In the same AC clock cycle, a second flux quantum is injected 404 into the JTL ring via a second injector in the JTL ring. The second injector can, for example, comprise a second injector JJ (e.g., JJ $J_{IN2}$ in FIG. 2A) in the JTL ring, and can further comprise associated transformer circuitry (e.g., transformer 210 in FIG. 2A) and/or data provision circuitry (e.g., JTLs 208 in FIG. 2A). The first and second injectors can, for example, be biased by different (e.g., opposite) phases of the AC clock. By the injection 402, 404, flux is stored 406 in a load inductor coupled to the JTL ring (e.g., load inductor $L_{LOAD}$ of FIG. 2A). The injection 402, 404 and flux storage 406 can continue repeatedly with subsequent cycles of the AC clock until a desired amount of flux is stored 408 in the load inductor, or the compliance of the JTL ring is reached 408, at which point flux stored in the load inductor can be unloaded 410, e.g., by transformer-coupling the flux to target RQL circuitry on the same IC as the flux-pump JTL ring. In other example methods similar to the method 400 of FIG. 4, additional (e.g., third, fourth, etc.) flux quanta can be injected into the JTL ring in the same clock cycle as the first and second flux quanta are injected into the ring via additional (e.g., third, fourth, etc.) injectors in the JTL ring.

A multi-flux quantum injection flux-pump DAC as described herein can be used to program a ramp waveform based on whether a respective logical high data signal is present at each of several respective injectors. The presence or absence of a logical high data signal at a given injector determines how many steps the DAC increases on a given clock cycle, thus allowing complex flux ramp waveforms to be programmed using RQL logic. A multi-flux quantum injection flux-pump DAC as described herein thus can generate patterns that are not purely linear ramps, but may have additional complexity that can increase the effectiveness of the DACs in sensitive environments. Such a feature may be useful, for example, when a DAC is used to adiabatically change the applied bias in a fixed time. By ramping quickly, but slowing down at a critical point in time, and then ramping quickly again, adiabaticity is preserved even while decreasing the time of the ramp.

Figure 5:
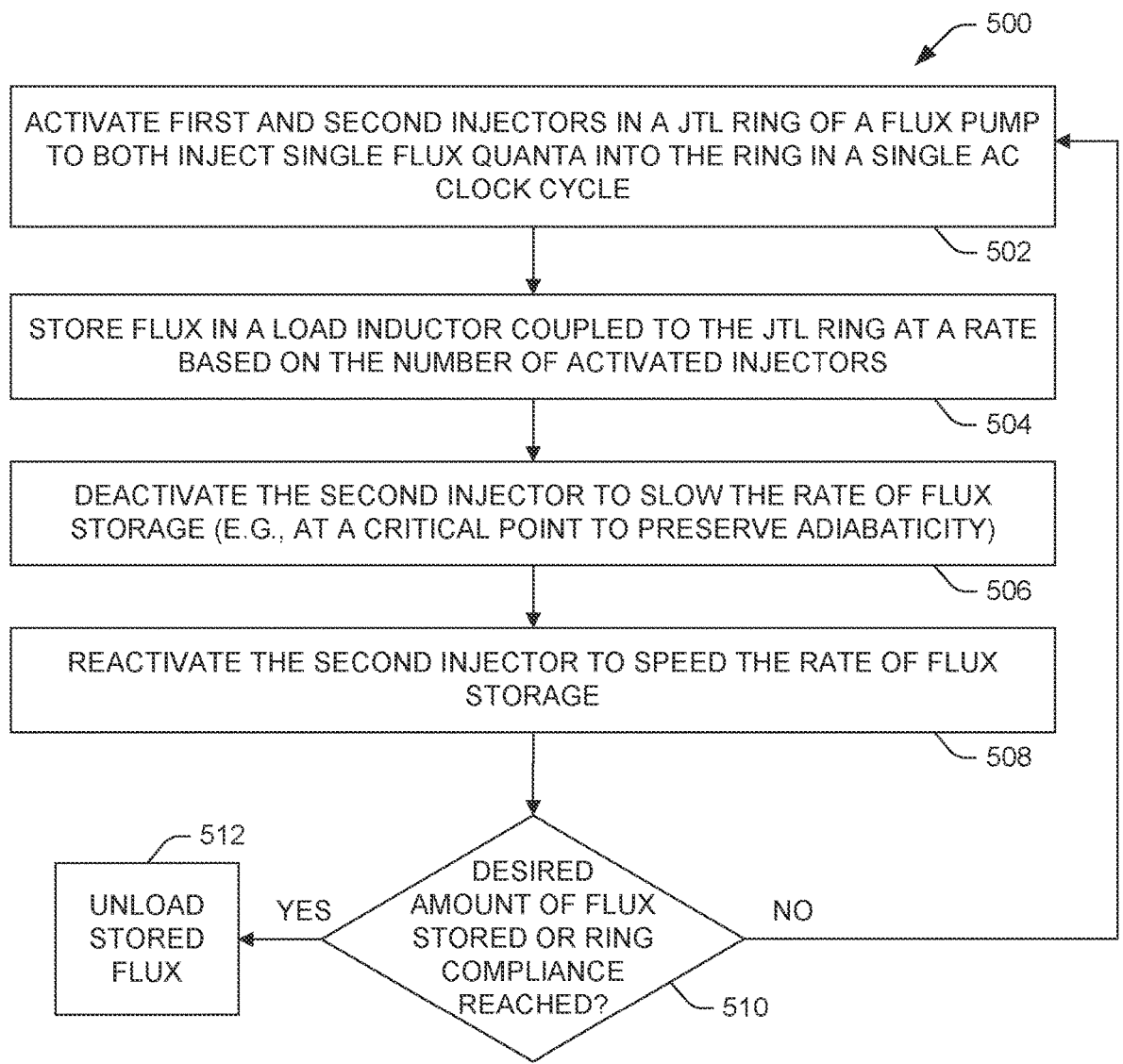
FIG. 5 is a flow chart showing an example method of variable-speed flux ramping in multi-flux quantum injection in a flux-pump DAC.

FIG. 5 illustrates a method 500 of variable-speed flux ramping in multi-flux quantum injection in a flux-pump DAC. In a single AC clock cycle (e.g., of an AC clock of an RQL system), both first and second injectors in a JTL ring of a flux-pump are activated 502 to inject respective single flux quanta into the JTL ring in the AC clock cycle. The activation can be performed, for example, by provision of logical high data signals as inputs to the injectors, e.g., via data input JTLs 204, 208 in the example circuit of FIG. 2A. As a result of the injector activations 502, the flux quanta are injected into the JTL ring of a flux pump, which can comprise, for example, at least four JJs (e.g., ring JJs $J_1$, $J_2$, $J_3$, and $J_4$ in FIG. 2A). The first injector can, for example, comprise a first injector JJ (e.g., JJ $J_{IN1}$ in FIG. 2A) in the JTL ring, and can further comprise associated transformer circuitry (e.g., transformer 206 in FIG. 2A) and/or data provision circuitry (e.g., JTLs 204 in FIG. 2A). The second injector can, for example, comprise a second injector JJ (e.g., JJ $J_{IN2}$ in FIG. 2A) in the JTL ring, and can further comprise associated transformer circuitry (e.g., transformer 210 in FIG. 2A) and/or data provision circuitry (e.g., JTLs 208 in FIG. 2A). The first and second injectors can, for example, be biased by different (e.g., opposite) phases of the AC clock. By the injection 502, flux is stored 504 in a load inductor (e.g., load inductor $L_{LOAD}$ of FIG. 2A) coupled to the JTL ring at a rate that is based on the number of activated injectors. In a subsequent AC clock cycle, one of the injectors (e.g., the second injector) is deactivated 506 to slow the rate of flux storage. This deactivation 506 and flux storage slowing can be timed, for example, to take place at a critical point in circuitry operation to preserve or increase circuit adiabaticity. The deactivation 506 can be performed, for example, by controlled provision of a logical low data signal as an input to the deactivated injector, e.g., via a corresponding one of data input JTLs 204, 208 in the example circuit of FIG. 2A. Subsequently, the second injector can be reactivated 508 and flux storage can thus resume at an increased rate. The injection and storage of flux can continue repeatedly with subsequent cycles of the AC clock until a desired amount of flux is stored 510 in the load inductor, or the compliance of the JTL ring is reached 510, at which point flux stored in the load inductor can be unloaded 512, e.g., by transformer-coupling the flux to target RQL circuitry on the same IC as the flux-pump JTL ring. In other example methods similar to the method 500 of FIG. 5, additional (e.g., third, fourth, etc.) injectors can be controllably activated and deactivated to permit for complex flux load ramp shapes.

Figure 6:
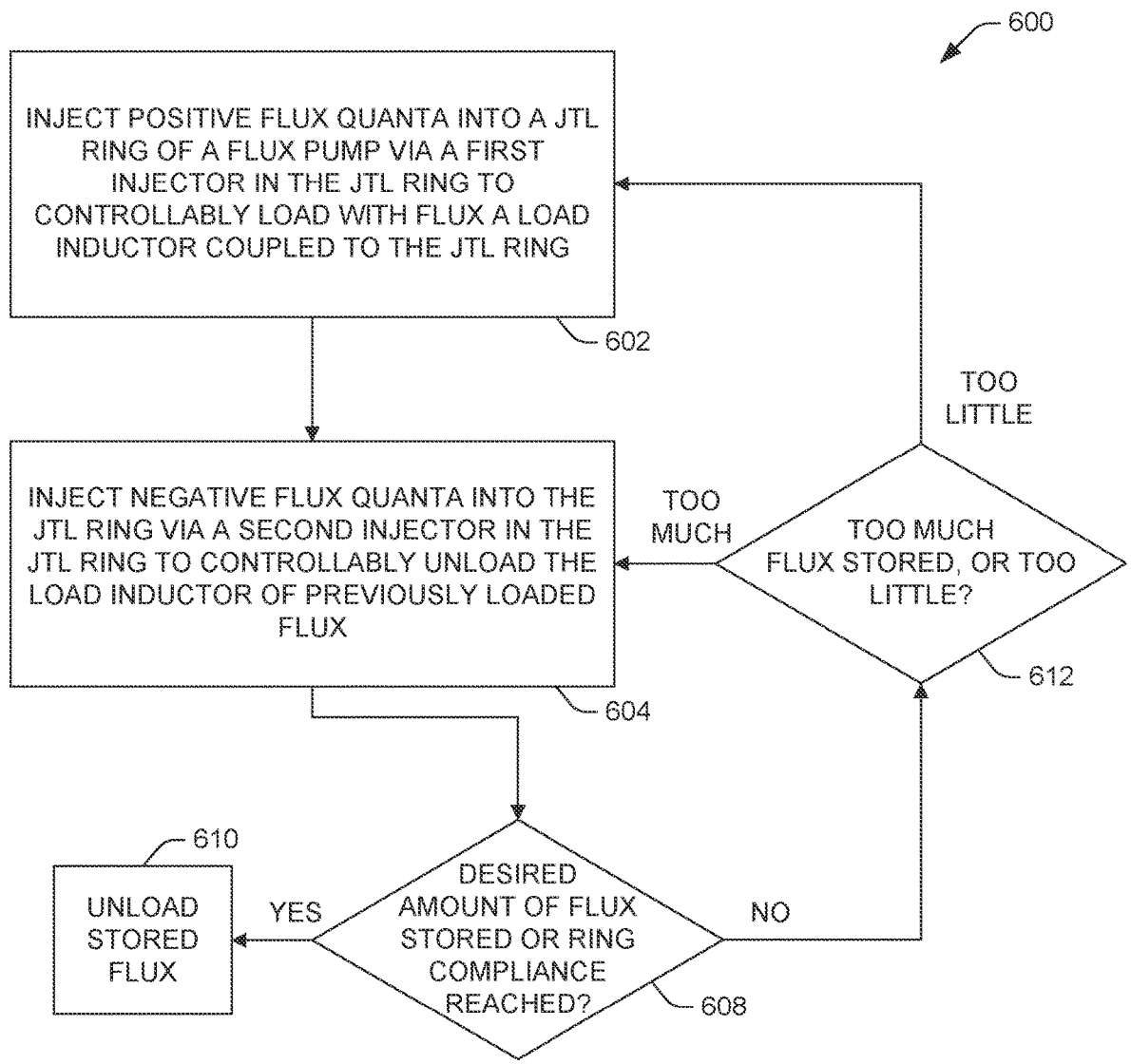
FIG. 6 is a flow chart showing an example method of controllable loading and unloading of flux in a flux-pump DAC using multi-flux quantum injection.

FIG. 6 illustrates a method 600 of controllable loading and unloading of flux in a flux-pump DAC using multi-flux quantum injection. Positive flux quanta are injected 602 into a JTL ring of a flux pump via a first injector in the JTL ring. The JTL ring can comprise, for example, at least four JJs (e.g., ring JJs $J_1$, $J_2$, $J_3$, and $J_4$ in FIG. 2T). The first injector can, for example, comprise a first injector JJ (e.g., JJ $J_{IN1}$ in FIG. 2T) in the JTL ring, and can further comprise associated transformer circuitry (e.g., transformer 206 in FIG. 2T) and/or data provision circuitry (e.g., JTLs 204 in FIG. 2T). Negative flux quanta are then injected 604 into the JTL ring via a second injector in the JTL ring. The second injector can, for example, comprise a second injector JJ (e.g., JJ $J_{IN2}$ in FIG. 2T) in the JTL ring, and can further comprise associated transformer circuitry (e.g., transformer 270 in FIG. 2T) and/or data provision circuitry (e.g., JTLs 208 in FIG. 2T). The first and second injectors can, for example, be biased by different (e.g., opposite) phases of an AC clock, e.g., an RQL AC clock. By the injection 602, 604, flux is respectively loaded onto and unloaded from a load inductor coupled to the JTL ring (e.g., load inductor $L_{LOAD}$ of FIG. 2T). The injection 602, 604 and flux storage can continue repeatedly with subsequent cycles of the AC clock until a desired amount of flux is stored 608 in the load inductor, or the compliance of the JTL ring is reached 608, at which point flux stored in the load inductor can be unloaded 610, e.g., by transformer-coupling the flux to target RQL circuitry on the same IC as the flux-pump JTL ring. If the desired amount of flux has not been stored, then it may be determined whether too much flux has been stored, in which case the negative flux quanta injection 604 can be repeated, or, on the contrary, that too much flux has been stored, in which case the positive flux quanta injection 602 can be repeated, until the desired amount of flux is stored. In the example method FIG. 6, single flux quanta can be injected into the ring with each AC clock cycle. In other example methods similar to the method of FIG. 6, multiple flux quanta can be injected into the JTL ring in the same clock cycle via additional (e.g., third, fourth, etc.) injectors in the JTL ring.

As described herein, multi-flux quantum injection flux-pump DAC such as in FIGS. 1 and 2A, and 2T can be used as a source of a precise, programmatically established amount of flux to be delivered to a target portion of a superconducting circuit. A multi-flux quantum injection flux-pump DAC such as in FIG. 1, 2A, or 2T can convert digital data provided on input signals $DATA_1$, $DATA_2$ to circulating current in the load inductor $L_{LOAD}$. A mutual inductance subsequently placed between the load inductor $L_{LOAD}$ and target circuitry can supply the circulating current as flux into the target circuitry on an integrated circuit that includes both the flux-pump DAC and the target circuitry. The precise, programmatically established amount of flux can thus be supplied on the integrated circuit without a need to use, or spatially or thermally accommodate, a probe linked to a current source outside of the cryogenic cold space, as described above as a flux source. Because a multi-injection flux-pump DAC as described herein can inject flux from multiple points around its ring, it can load flux at higher speeds and at more variable speeds (e.g., controllably variable speeds) than flux-pump DACs having only one injection point. A multi-flux quantum injection flux-pump DAC as described herein thus has an increased maximum current ramp rate as compared to a single-flux quantum injection flux-pump DAC even when operated at the same clock frequency with the same load inductance. A multi-injection flux-pump DAC as described herein can, for example, have its flux loading ramp shape precisely controlled to preserve or enhance circuit adiabaticity.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A flux-pump digital-to-analog converter (DAC) comprising:
a ring of Josephson transmission line (JTL) stages, the ring comprising:
a plurality of inductors, arranged such that each inductor couples a ring Josephson junction (JJ) of one JTL stage to a ring JJ of an adjacent JTL stage, wherein each ring JJ is coupled between a respective outer ring node and an inner ring node, and each inductor is coupled between adjacent outer ring nodes; and
first and second injector Josephson junctions (JJs), each of the first and second injector JJs being coupled between a pair of outer ring nodes and connected in series with one or more of the plurality of inductors and ring JJs, the first and second injector JJs being configured to inject flux into the ring; and
a load inductor coupled to ring JJs of the ring and configured to store the flux injected into the ring, wherein the injected flux is delivered to the load inductor by circulating around the ring through the ring JJs and the plurality of inductors coupling adjacent JTL stages.

2. The flux-pump DAC of claim 1, wherein the ring of JTL stages comprises:
a first ring JJ coupled between a first outer ring node and an inner ring node;
a first ring inductor of the plurality of inductors coupled between the first outer ring node and a second outer ring node;
a second ring JJ coupled between the second outer ring node and the inner ring node;
a second ring inductor of the plurality of inductors coupled between the second outer ring node and a third outer ring node;
a third ring JJ coupled between a fourth outer ring node and the inner ring node;
a third ring inductor of the plurality of inductors coupled between the fourth outer ring node and a fifth outer ring node;
a fourth ring JJ coupled between the fifth outer ring node and the inner ring node; and
a fourth ring inductor of the plurality of inductors coupled between the fifth outer ring node and a sixth outer ring node.

3. The flux-pump DAC of claim 2, wherein:
the first injector JJ is coupled between the sixth outer ring node and the first outer ring node, and
the second injector JJ is coupled between the third outer ring node and the fourth outer ring node.

4. The flux-pump DAC of claim 2, wherein:
the first ring JJ is biased by a 0° phase of an AC clock provided by a first bias tap coupled to the first outer ring node;
the second ring JJ is biased by a 90° phase of the AC clock provided by a second bias tap coupled to the second outer ring node;
the third ring JJ is biased by a 180° phase of the AC clock provided by a third bias tap coupled to the fourth outer ring node; and the fourth ring JJ is biased by a 270° phase of the AC clock provided by a fourth bias tap coupled to the fifth outer ring node.

5. The flux-pump DAC of claim 4, wherein:
the first injector JJ is coupled between the sixth outer ring node and the first outer ring node, and
the second injector JJ is coupled between the third outer ring node and the fourth outer ring node.

6. The flux-pump DAC of claim 5, further comprising:
a first input transformer having a first secondary inductor coupled between the first and sixth outer ring nodes, the first input transformer coupling a first input control flux to the first injector JJ; and
a second input transformer having a second secondary inductor coupled between the third and fourth outer ring nodes, the second input transformer coupling a second input control flux to the second injector JJ.

7. The flux-pump DAC of claim 6, further comprising:
a first input JTL coupled to a first primary inductor of the first input transformer, the first input JTL configured to convey a first input control signal to the first injector JJ; and
a second input JTL coupled to a second primary inductor of the second input transformer, the second input JTL configured to convey a second input control signal to the second injector JJ.

8. The flux-pump DAC of claim 6, further comprising:
a first DC bias transformer having a third secondary inductor coupled between the first and sixth outer ring nodes, the first DC bias transformer configured to provide DC bias to the first injector JJ; and
a second DC bias transformer having a fourth secondary inductor coupled between the third and fourth outer ring nodes, the second DC bias transformer configured to provide DC bias to the second injector JJ.

9. The flux-pump DAC of claim 8, further comprising a DC bias line having, in series, a first primary inductor of the first DC bias transformer and a second primary inductor of the second DC bias transformer.

10. The flux-pump DAC of claim 1, further comprising third and fourth injector JJs in the ring, each of the third and fourth injector JJs configured to inject flux into the ring.

11. A reciprocal quantum logic (RQL) system comprising the flux-pump DAC of claim 1 fabricated on an RQL integrated circuit (IC) in a cryogenic cold space, the RQL system further comprising:
target RQL circuitry on the RQL IC, the target RQL circuitry inductively coupled to the load inductor and configured to receive flux stored by the load inductor; and
one or more generators of bias signals outside of the cryogenic cold space, including a first clock AC bias signal, a second clock AC bias signal that is 90° out of phase with the first clock AC bias signal, and at least one DC bias signal, the one or more generators of bias signals coupled to the RQL IC.

12. A method of multi-flux quantum injection, the method comprising:
in an AC clock cycle, injecting a first quantum of magnetic flux into a Josephson transmission line (JTL) ring of a flux pump via a first injector in the JTL ring coupled between a first pair of outer ring nodes of the JTL ring;
in the AC clock cycle, injecting a second quantum of magnetic flux into the JTL ring via a second injector in the JTL ring coupled between a second pair of outer ring nodes of the JTL ring, wherein each of the first and second quantum of magnetic fluxes are advanced around the JTL ring through a plurality of JTL stages of the JTL ring, each JTL stage comprising a ring Josephson junction (JJ) coupled between an outer ring node and a common inner ring node of the JTL ring, and each of a plurality of inductors of the JTL ring being coupled between adjacent outer ring nodes of the JTL ring and arranged to couple a ring JJ of one JTL stage to a ring JJ of an adjacent JTL stage; and storing the first and second quanta of magnetic flux in a load inductor coupled to ring JJs of the JTL ring to increase an amount of magnetic flux stored in the load inductor.

13. The method of claim 12, wherein the AC clock cycle is a first AC clock cycle, the method further comprising:

based on a desired amount of magnetic flux not yet being stored in the load inductor and a compliance of the JTL ring not yet being reached, injecting third and fourth flux quanta into the JTL ring via the first and second injectors, respectively, in a second AC clock cycle; and storing the third and fourth flux quanta in a load inductor coupled to the JTL ring to increase the amount of magnetic flux stored in the load inductor.

14. The method of claim 13, further comprising, based on the desired amount of magnetic flux being stored in the load inductor or the compliance of the JTL ring having been reached, unloading the magnetic flux stored in the load inductor to target circuitry.

15. The method of claim 12, wherein the first and second injectors are respectively AC biased by first and second AC clock signals that are 180° out of phase with each other.

16. The method of claim 12, further comprising:

in the AC clock cycle, injecting a third quantum of magnetic flux into the JTL ring via a third injector in the JTL ring;

in the AC clock cycle, injecting a fourth quantum of magnetic flux into the JTL ring via a fourth injector in the JTL ring; and storing the third and fourth quanta of magnetic flux in a load inductor coupled to the JTL ring to increase the amount of magnetic flux stored in the load inductor.

17. The method of claim 16, wherein:

the first and second injectors are respectively AC biased by first and second AC clock signals that are 180° out of phase with each other; and the third and fourth injectors are respectively AC biased by third and fourth AC clock signals that are 180° out of phase with each other.

18. A method of variable-speed flux ramping using multi-flux quantum injection, the method comprising:

in a Josephson transmission line (JTL) ring comprising a plurality of JTL stages of a flux pump, each JTL stage comprising a ring Josephson junction (JJ) coupled between an outer ring node and a common inner ring node of the JTL ring, and a plurality of inductors of the JTL ring coupled between adjacent outer ring nodes and arranged to couple a ring JJ of one JTL stage to a ring JJ of an adjacent JTL stage:

activating first and second injectors, each of the first and second injectors being coupled between a respective pair of outer ring nodes of the JTL ring and configured to inject a single flux quanta into the JTL ring in a single AC clock cycle, each flux quanta being advanced around the JTL ring through the ring JJs and the plurality of inductors;

storing the injected single flux quanta as stored magnetic flux in a load inductor coupled to the JTL ring at a rate of flux storage that is based on a number of activated injectors; and deactivating the second injector to slow the rate of flux storage in the load inductor.

19. The method of claim 18, further comprising reactivating the second injector to speed the rate of flux storage.

20. The method of claim 19, wherein:

activation or reactivation of either of the first or second injectors is by provision to a respective one of the first or second injectors of a logical high reciprocal quantum logic (RQL) data signal comprising single flux quantum (SFQ) pulses, and deactivation of either of the first or second injectors is by provision to a respective one of the first or second injectors of a logical low RQL data signal.

* * * * *

UNITED STATES PATENT AND TRADEMARK OFFICE
CERTIFICATE OF CORRECTION

| | | |
|---|---|---|
| PATENT NO. | : 12,401,368 B2 | Page 1 of 1 |
| APPLICATION NO. | : 18/315187 | |
| DATED | : August 26, 2025 | |
| INVENTOR(S) | : Aaron Christopher Lee, Anthony Joseph Przybysz and Robert Miller | |

It is certified that error appears in the above-identified patent and that said Letters Patent is hereby corrected as shown below:

On the Title Page

Item (72) Inventors: "Hanover, ND (US)"
Should read: --Hanover, MD (US)--

Signed and Sealed this
Fourteenth Day of October, 2025

John A. Squires
*Director of the United States Patent and Trademark Office*